(12) United States Patent
Jung et al.

(10) Patent No.: US 12,331,235 B2
(45) Date of Patent: Jun. 17, 2025

(54) QUANTUM DOT COMPOSITION, LIGHT EMITTING ELEMENT AND DISPLAY DEVICE INCLUDING THE SAME

(71) Applicant: Samsung Display Co., Ltd., Yongin-si (KR)

(72) Inventors: Yunku Jung, Cheonan-si (KR); Yunhyuk Ko, Asan-si (KR); Minki Nam, Incheon (KR); Sungwoon Kim, Yongin-si (KR); Junwoo Park, Hwaseong-si (KR); Sooho Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 906 days.

(21) Appl. No.: 17/219,442

(22) Filed: Mar. 31, 2021

(65) Prior Publication Data
US 2021/0371737 A1      Dec. 2, 2021

(30) Foreign Application Priority Data
Jun. 2, 2020   (KR) .................. 10-2020-0066724

(51) Int. Cl.
*C09K 11/02*       (2006.01)
*B82Y 20/00*       (2011.01)
(Continued)

(52) U.S. Cl.
CPC .......... *C09K 11/025* (2013.01); *H10K 50/115* (2023.02); *H10K 59/38* (2023.02);
(Continued)

(58) Field of Classification Search
CPC .......................... C09K 11/025; H10K 50/115
See application file for complete search history.

(56) References Cited

U.S. PATENT DOCUMENTS

| 10,377,944 B2 | 8/2019 | Naasani |
| 2010/0068522 A1* | 3/2010 | Pickett .................. B82Y 30/00 977/773 |

(Continued)

FOREIGN PATENT DOCUMENTS

| KR | 2012-0138165 | * 12/2012 |
| KR | 10-1223671 B1 | 1/2013 |

(Continued)

OTHER PUBLICATIONS

Allan, Jenna M. et al., "Surface functionalized bare and core-shell quantum dots in poly (ethylene-co-vinyl acetate) for light selective nanocomposite films", Solar Energy Materials & Solar Cells (2014), 123; pp. 30-40.

(Continued)

*Primary Examiner* — C Melissa Koslow
(74) *Attorney, Agent, or Firm* — Womble Bond Dickinson (US) LLP

(57) ABSTRACT

A quantum dot composition includes a quantum dot and a ligand bonded to a surface of the quantum dot, wherein the ligand includes a head portion bonded to the surface of the quantum dot, and a tail portion containing a crosslinkable functional group. The quantum dot composition according to one or more embodiments may be applied to an emission layer of a light emitting element and a display device to improve luminous efficiency and service life of the light emitting element and the display device.

10 Claims, 13 Drawing Sheets

(51) Int. Cl.
*B82Y 30/00* (2011.01)
*B82Y 40/00* (2011.01)
*H10K 50/115* (2023.01)
*H10K 59/38* (2023.01)
*H10K 59/50* (2023.01)
*H10K 102/00* (2023.01)

(52) U.S. Cl.
CPC .............. *H10K 59/50* (2023.02); *B82Y 20/00* (2013.01); *B82Y 30/00* (2013.01); *B82Y 40/00* (2013.01); *H10K 2102/00* (2023.02)

(56) References Cited

U.S. PATENT DOCUMENTS

2011/0256404 A1* 10/2011 Tulsky ................. C09K 11/025
428/407

2018/0092815 A1   4/2018  Naasani et al.
2019/0312204 A1* 10/2019  Kang ..................... H10K 50/11

FOREIGN PATENT DOCUMENTS

| KR | 10-2014-0108684 A | 9/2014 |
| KR | 20170064164 A | 6/2017 |
| KR | 10-1835110 B1 | 3/2018 |
| KR | 20180106126 A | 10/2018 |
| KR | 10-2019-0055149 A | 5/2019 |
| WO | WO 2019/211257 | * 11/2019 |
| WO | WO 2022/190191 | * 9/2022 |

OTHER PUBLICATIONS

Park, Jong-Jin et al., "Photopatternable Quantum Dots Forming Quasi-Ordered Arrays", Nano Letters (2010), pp. 2310-2317.

* cited by examiner

QUANTUM DOT COMPOSITION, LIGHT EMITTING ELEMENT AND DISPLAY DEVICE INCLUDING THE SAME

CROSS-REFERENCE TO RELATED APPLICATION

This application claims priority to and the benefit of Korean Patent Application No. 10-2020-0066724, filed on Jun. 2, 2020, the entire content of which is hereby incorporated by reference.

BACKGROUND

One or more aspects of embodiments of the present disclosure herein relate to a quantum dot composition, a light emitting element including an emission layer formed from the quantum dot composition, and a display device including the same.

Various display devices used for multimedia devices such as a television set, a mobile phone, a tablet computer, a navigation system, and/or a game console are being developed. In such display devices, a self-luminescent display element is used, which accomplishes display of images by causing an organic compound-containing light emitting material to emit light.

In addition, development of a light emitting element using quantum dots as a light emitting material is underway as an effort to enhance the color reproducibility of display devices, and there is a demand (or desire) for increasing the luminous efficiency and service life of a light emitting element using quantum dots.

SUMMARY

One or more aspects of embodiments of the present disclosure are directed toward a quantum dot composition, which can be used in an emission layer of a light emitting element to exhibit improved luminous efficiency.

One or more aspects of embodiments of the present disclosure are also directed toward a light emitting element having improved luminous efficiency by including, in an emission layer, a quantum dot having a surface to which a ligand material having improved charge injection properties is bonded.

One or more aspects of embodiments of the present disclosure further provide a display device exhibiting improved luminous efficiency, by including a light emitting element containing, in an emission layer, a quantum dot having a surface to which a ligand material having improved charge injection properties is bonded.

An embodiment of the present disclosure provides a quantum dot composition including a quantum dot and a ligand bonded to a surface of the quantum dot, wherein the ligand includes a head portion bonded to the surface of the quantum dot, and a tail portion containing a crosslinkable functional group at a terminal of the ligand.

The crosslinkable functional group may be a heat crosslinkable functional group.

The ligand may further include a chain portion connecting the head portion and the tail portion.

The chain portion may include 2 to 20 carbon atoms.

The crosslinkable functional group may be a vinyl group, a hydroxy group, a carboxyl group, an epoxy group, an amide group, an amine group, an azide group, an oxetanyl group, and/or an isocyanate group.

The ligand may be a monodentate ligand or a bidentate ligand.

The head portion may include a thiol group, a dithio acid group, a phosphine group, a catechol group, an amine group, and/or a carboxylic acid group.

The chain portion may further include an amine group, an oxy group, a thio group, an ester group, an ether group, an aryl group, and/or an amide group.

The ligand may be represented by Formula A or Formula B.

In Formulae A and B, X, $X_1$ and $X_2$ may be each independently S or NH, and Y may be represented by at least one among Formulae 1 to 7.

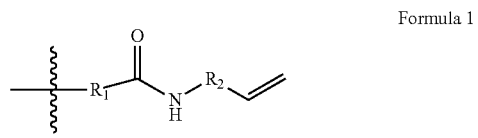

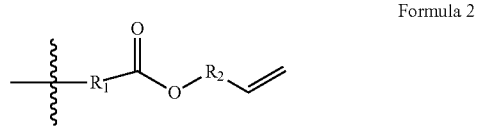

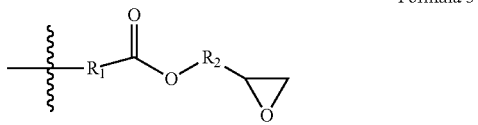

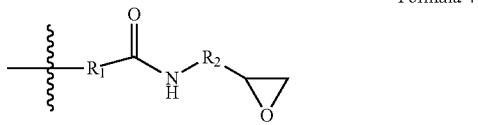

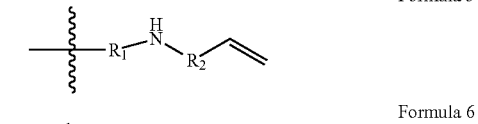

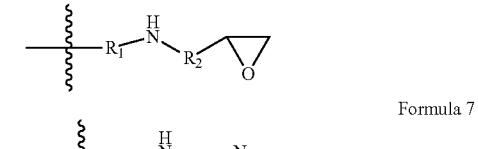

In Formulae 1 to 7,

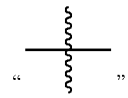

indicates a position connected to Formula A or Formula B, and $R_1$ and $R_2$ are each independently an alkyl group having 1 to 20 carbon atoms, where a total number of carbon atoms of $R_1$ and $R_2$ is 20 or less.

The quantum dot composition may further include an organic solvent, and the quantum dot may be dispersed in the organic solvent.

The quantum dot may be a semiconductor nanocrystal including a core and a shell around the core.

In one or more embodiments of the present disclosure, a light emitting element includes a first electrode, a second electrode facing the first electrode, and an emission layer disposed between the first electrode and the second electrode, the emission layer containing a plurality of quantum dot complexes having ligands, wherein a quantum dot complex of the plurality of quantum dot complexes is bonded to at least two other quantum dot complexes through the ligands.

The quantum dot complex may include a quantum dot having a core and a shell around the core, and a ligand having a hydrophilic group bonded to a surface of the quantum dot.

The hydrophilic group may be a thiol group, a dithio acid group, a phosphine group, a catechol group, an amine group, and/or a carboxylic acid group.

The ligand may include 2 to 20 carbon atoms.

In one or more embodiments of the present disclosure, a display device includes a plurality of light emitting elements, and a light conversion layer disposed on the plurality of light emitting elements and having a light control unit containing a plurality of quantum dots connected to each other through binding of ligands, wherein each of the plurality of light emitting element includes a first electrode, a second electrode facing the first electrode, and an emission layer disposed between the first electrode and the second electrode.

The light emitting elements may emit a first color light, and the light control unit may include a first light control unit to transmit the first color light, a second light control unit to convert the first color light into a second color light, and a third light control unit to convert the first color light into a third color light.

Each of the plurality of quantum dot may includes a core and a shell around the core, and a ligand of the ligands may include a hydrophilic group bonded to a surface of a corresponding one of the plurality of quantum dots.

The hydrophilic group may be a thiol group, a dithio acid group, a phosphine group, a catechol group, an amine group, and/or a carboxylic acid group.

The display device may further include a color filter layer disposed on the light emitting elements, wherein the color filter layer may include a first filter to transmit the first color light, a second filter to transmit the second color light, and a third filter to transmit the third color light.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
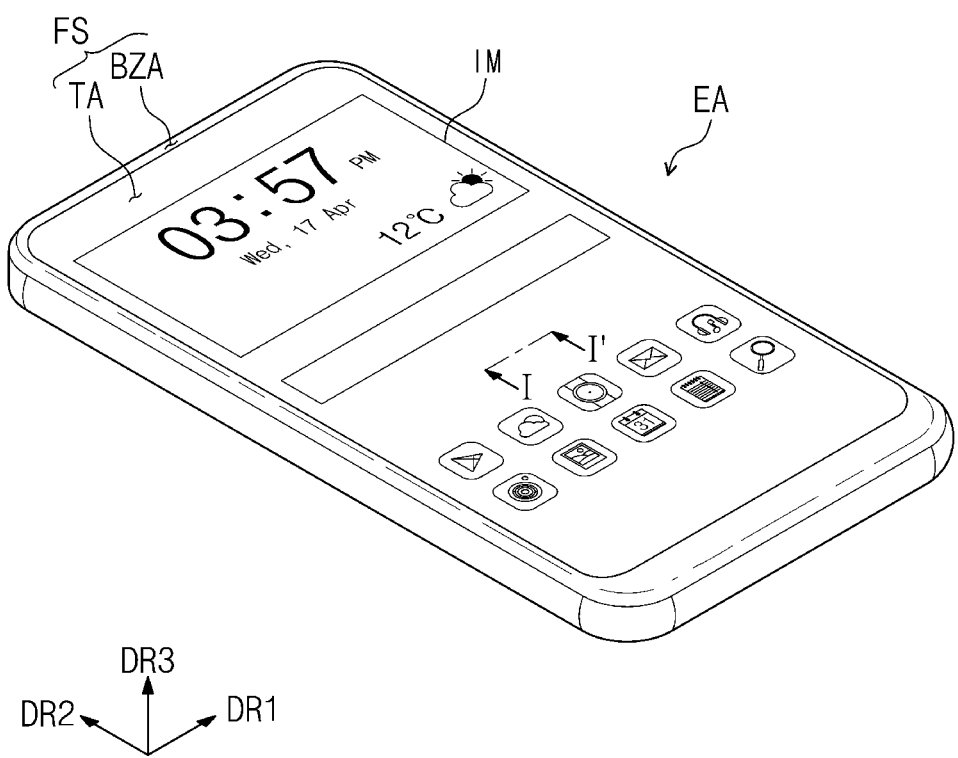
FIG. 1 is a combined perspective view of an electronic device of one or more embodiments.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the invention.

In the present description, when an element (or a region, a layer, a portion, etc.) is referred to as being "on," "connected to," or "coupled to" another element, it means that the element may be directly disposed on/connected to/coupled to the other element, or that a third element may be disposed therebetween.

In the present disclosure, "directly disposed" or "directly on" means that there is no layer, film, region, plate and/or the like added between a layer, a film, a region, a plate and/or the like and another element. For example, "directly disposed" may mean disposing two layers or two members without additional members, such as an adhesive member, therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, a quantum dot composition according to one or more embodiments of the present disclosure, a light emitting element, and a display device including the same will be described with reference to the accompanying drawings.

Figure 2:
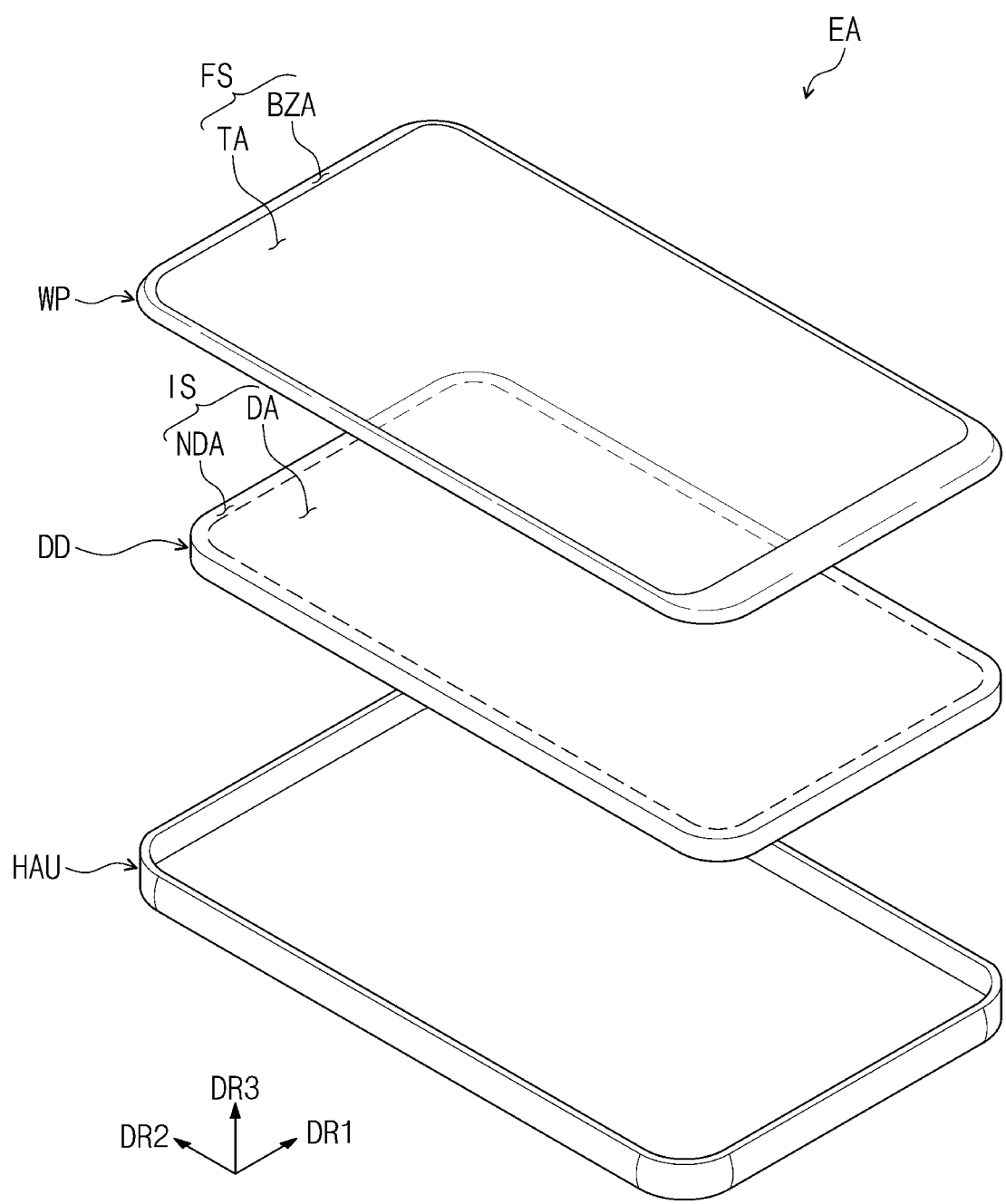
FIG. 2 is an exploded perspective view of an electronic device of one or more embodiments.
Figure 3:
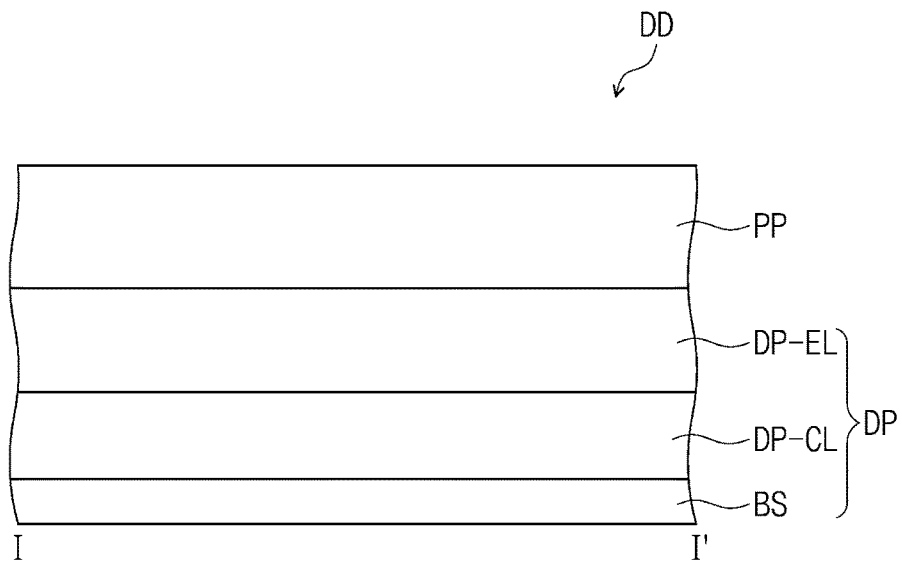
FIG. 3 is a cross-sectional view of a display device of one or more embodiments.
Figure 4:
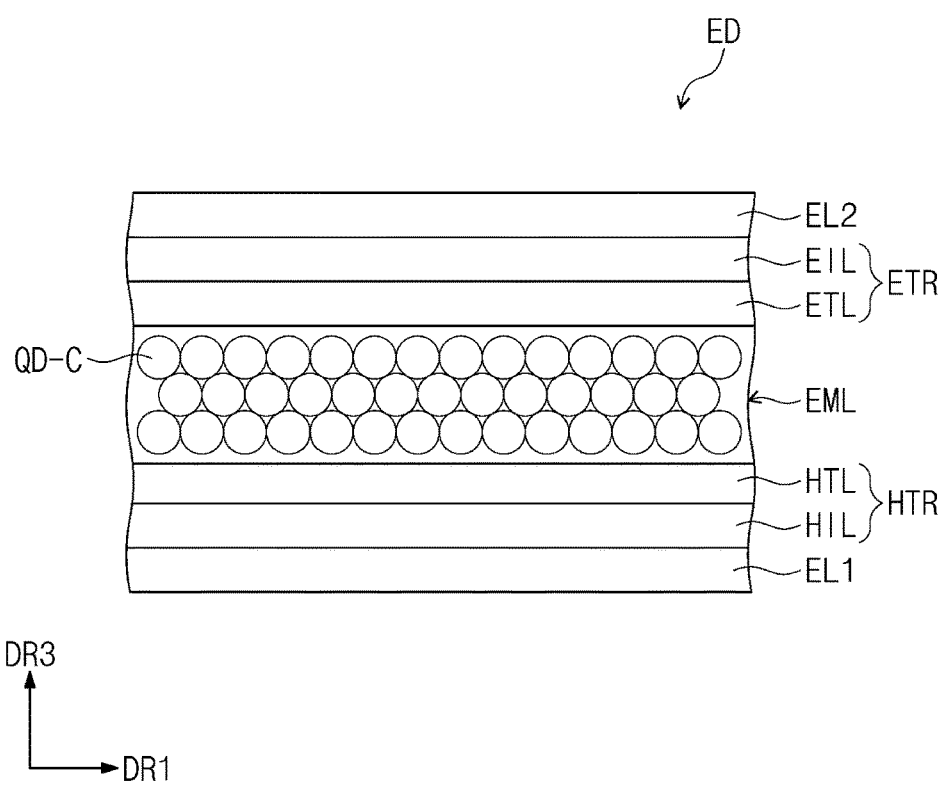
FIG. 4 is a cross-sectional view of a light emitting element of one or more embodiments.

FIG. 1 is a perspective view of an electronic device EA of one or more embodiments. FIG. 2 is an exploded perspective view of an electronic device EA of one or more embodiments. FIG. 3 is a cross-sectional view of a display device DD of one or more embodiments. FIG. 4 is a cross-sectional view of a light emitting element ED of one or more embodiments.

In one or more embodiments, an electronic device EA may be a large-sized electronic device such as a television set, a monitor, and/or an outdoor billboard. In one or more embodiments, the electronic device EA may be a small- and/or medium-sized electronic device such as a personal computer, a laptop computer, a personal digital terminal, a car navigation unit, a game console, a smartphone, a tablet, and/or a camera. However, these are merely presented as an example, and the electronic device EA may be another suitable electronic device, without departing from the present disclosure. In the embodiment of FIG. 1, a smartphone is exemplarily illustrated as the electronic device EA.

The electronic device EA may display an image IM through a front surface FS. The image IM may include a still image as well as a dynamic image. FIG. 1 illustrates that the front surface FS is parallel to a plane defined by a first direction DR1 and a second direction DR2, crossing the first direction DR1. However, this is presented as an example, and in one or more other embodiments, the front surface FS of the electronic device EA may have a curved shape.

Among the normal directions of the front surface FS of the electronic device EA, that is, the thickness directions of the electronic device EA, a direction in which the image IM is displayed is indicated by a third direction DR3. A front surface (or an upper surface) and a rear surface (or a lower surface) of each member may be separated along the third direction DR3.

A fourth direction DR4 (see FIG. 13) may be a direction between the first direction DR1 and the second direction DR2. The fourth direction DR4 may be positioned on a plane parallel to the plane defined by the first direction DR1 and the second direction DR2. However, the directions indicated by the first to fourth directions DR1, DR2, DR3 and DR4 are relative concepts, and may thus be changed to other directions.

In one or more embodiments, the electronic device EA may include a foldable display device having a folding area and a non-folding area, and/or a bending display device having at least one bent portion.

The electronic device EA may include a display device DD and a housing HAU. In the electronic device EA, the front surface FS may correspond to a front surface of the display device DD, and may correspond to a front surface of a window WP. Accordingly, the like reference alphas FS will be given (used) for the front surface of the electronic device EA, the front surface of the display device DD, and the front surface of the window WP.

The housing HAU may accommodate the display device DD. The housing HAU may be disposed to cover the display device DD such that an upper surface, which is the display surface IS of the display device DD, is exposed. The housing HAU may cover a side surface and a bottom surface of the display device DD, and expose the overall (e.g., entire) upper surface. However, the embodiments of the present disclosure are not limited thereto, and the housing HAU may cover a part of the upper surface, as well as the side and bottom surfaces of the display device DD.

In the electronic device EA of one or more embodiments, the window WP may include an optically transparent insulating material. The window WP may include a transmission area TA and a bezel area BZA. The front surface FS of the window WP, including the transmission area TA and the bezel area BZA, corresponds to the front surface FS of the electronic device EA.

In FIGS. 1 and 2, the transmission area TA is shown in a rectangular shape with vertices rounded. However, this is exemplarily illustrated, and the transmission area TA may have various suitable shapes and is not limited to any one embodiment.

The transmission area TA may be an optically transparent area. The bezel area BZA may be an area having a relatively lower light transmittance than the transmission area TA. The bezel area BZA may have a predetermined (or set) color. The bezel area BZA may be adjacent to the transmission area TA and may surround the transmission area TA. The bezel area BZA may define the shape of the transmission area TA. However, the embodiments of the present disclosure are not limited to the one illustrated, and the bezel area BZA may be disposed adjacent only to one side of the transmission area TA, and a part thereof may be omitted.

The display device DD may be disposed under the window WP. In the present description, "below" may indicate a direction or side opposite to the direction or side in which the display device DD provides an image.

In one or more embodiments, the display device DD may be substantially configured to generate an image IM. The image IM generated in the display device DD is displayed on the display surface IS, and is viewed by a user through the transmission area TA from the outside. The display device DD includes a display area DA and a non-display area NDA. The display area DA may be an area activated according to electrical signals. The non-display area NDA may be an area covered by the bezel area BZA. The non-display area NDA is adjacent to the display area DA. The non-display area NDA may surround the display area DA.

Referring to FIG. 3, the display device DD may include a display panel DP and a light control layer PP disposed on the display panel DP. The display panel DP may include a display element layer DP-EL. The display element layer DP-EL includes a light emitting element ED.

The light control layer PP may be disposed on the display panel DP to control light reflected from the display panel DP due to external light. The light control layer PP may include, for example, a polarizing layer and/or a color filter layer.

In the display device DD of one or more embodiments, the display panel DP may be a light emitting display panel. For example, the display panel DP may be a quantum dot light emitting display panel including a quantum dot light emitting element. However, the embodiments of the present disclosure are not limited thereto.

The display panel DP may include a base substrate BS, a circuit layer DP-CL disposed on the base substrate BS, and a display element layer DP-EL disposed on the circuit layer DP-CL.

The base substrate BS may be a member providing a base surface in which the display element layer DP-EL is disposed. The base substrate BS may be a glass substrate, a metal substrate, a plastic substrate, etc. However, the embodiments of the present disclosure are not limited thereto, and the base substrate BS may be an inorganic layer, an organic layer, or a composite material layer (including an inorganic material and an organic material). The base substrate BS may be a flexible substrate that may be readily bent and/or folded.

In one or more embodiments, the circuit layer DP-CL may be disposed on the base substrate BS, and the circuit layer DP-CL may include a plurality of transistors. The transistors each may include a control electrode, an input electrode, and an output electrode. For example, the circuit layer DP-CL may include a switching transistor and a driving transistor to drive the light emitting element ED of the display element layer DP-EL.

FIG. 4 is a view showing a light emitting element ED according to one or more embodiments, and referring to FIG. 4, the light emitting element ED according to one or more embodiments includes a first electrode EL1, a second electrode EL2 facing the first electrode EL1, and a plurality of functional layers disposed between the first electrode EL1 and the second electrode EL2 and having an emission layer EML.

The plurality of functional layers may include a hole transport region HTR disposed between the first electrode EL1 and the emission layer EML, and an electron transport region ETR disposed between the emission layer EML and the second electrode EL2. In one or more embodiments, a capping layer may be further disposed on the second electrode EL2.

The hole transport region HTR and the electron transport region ETR each may include a plurality of sub functional layers. For example, the hole transport region HTR may include a hole injection layer HIL and a hole transport layer HTL as sub functional layers, and the electron transport region ETR may include an electron injection layer EIL and an electron transport layer ETL as sub functional layers. However, the embodiments of the present disclosure are not limited thereto, and the hole transport region HTR may further include an electron blocking layer as a sub functional layer, and the electron transport region ETR may further include a hole blocking layer as a sub functional layer.

In the light emitting element ED according to one or more embodiments, the first electrode EL1 has conductivity. The first electrode EL1 may be formed of a metal alloy or any suitable conductive compound. The first electrode EL1 may be an anode. The first electrode EL1 may be a pixel electrode.

In the light emitting element ED according to one or more embodiments, the first electrode EL1 may be a reflective electrode. However, the embodiment of the present disclosure is not limited thereto. For example, the first electrode EL1 may be a transmissive electrode, or a transflective electrode. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In one or more embodiments, the first electrode EL1 may have a multi-layer structure including a reflective film or a transflective film formed of any of the materials described above, and a transparent conductive film formed of indium tin oxide (ITO), indium zinc oxide (IZO), zinc oxide (ZnO), indium tin zinc oxide (ITZO), etc. For example, the first electrode EL1 may be a multi-layer metal film, and may have a stack structure of metal films of ITO/Ag/ITO.

The hole transport region HTR may be provided on the first electrode EL1. The hole transport region HTR may include a hole injection layer HIL, a hole transport layer HTL, etc. In one or more embodiments, the hole transport region HTR may further include at least one of a hole buffer layer or an electron blocking layer EBL, in addition to the hole injection layer HIL and the hole transport layer HTL. The hole buffer layer may compensate a resonance distance according to the wavelength of light emitted from an emission layer EML, and may thus increase luminous efficiency. Materials which may be included in the hole transport region HTR may be used as materials included in the hole buffer layer. The electron blocking layer is a layer that serves to prevent or reduce the injection of electrons from the electron transport region ETR into the hole transport region HTR.

The hole transport region HTR may have a single layer formed of (e.g., consisting of) a single material, a single layer formed of a plurality of different materials, or a multi-layer structure including a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in the stated order from the first electrode EL1, but the embodiments are not limited thereto.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl) —N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PAN I/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole-based derivatives (such as N-phenyl carbazole and/or polyvinyl carbazole), fluorine-based derivatives, N,N'-bis(3-methylphenyl)-N,N'-diphenyl-[1,1-biphenyl]-4, 4'-diamine (TPD), triphenylamine-based derivatives (such as 4,4',4"-tris(N-carbazolyl)triphenylamine (TCTA)), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

An emission layer EML may be provided on the hole transport region HTR. In the light emitting element ED according to one or more embodiments, the emission layer EML may be formed from a quantum dot composition of one or more embodiments. The emission layer EML includes a plurality of quantum dot complexes QD-C. The quantum dot complex QD-C included in the emission layer EML may be in the state of being bonded to two or more other quantum dot complexes QD-C. The quantum dot complex QD-C will be described in more detail with reference to FIGS. 7 and 8.

In the light emitting element ED of one or more embodiments, an emission layer EML may include a host and a dopant. In one or more embodiments, the emission layer EML may include a quantum dot complex QD-C as a dopant material. In one or more embodiments, the emission layer EML may further include a host material. In the light emitting element ED of one or more embodiments, the emission layer EML may emit fluorescence. For example, the quantum dot complex QD-C may be used as a fluorescent dopant material.

The light emitting layer EML may, for example, have a thickness of about 5 nm to about 20 nm, or about 10 nm to about 20 nm.

The emission layer EML may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

In the light emitting element ED of one or more embodiments, an electron transport region ETR may be provided on the emission layer EML. The electron transport region ETR may include at least one among a hole blocking layer, an electron transport layer ETL, and an electron injection layer EIL, but the embodiments of the present disclosure are not limited thereto.

The electron transport region ETR may have a single layer formed of (e.g., consisting of) a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In one or more embodiments, the electron transport region ETR may have a single layer structure formed of a plurality of different materials, or may have a structure in which an electron transport layer ETL/electron injection layer EIL, and a hole blocking layer/electron transport layer ETL/electron injection layer EIL are stacked in the stated order from the emission layer EML, but is not limited thereto. The thickness of the electron transport region ETR may be, for example, from about 200 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3, 5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphtalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), or a mixture thereof. The thickness of the electron transport layer ETL may be from about 100 Å to about 1,000 Å, and may be, for example, from about 150 Å to about 500 Å. When the thickness of the electron transport layer ETL satisfies the above-described range, satisfactory (or suitable)

electron transport properties may be obtained without a substantial increase in driving voltage.

When the electron transport region ETR includes the electron injection layer EIL, the electron transport region ETR may include a halogenated metal, a lanthanide metal, or a co-deposited material of a halogenated metal and a lanthanide metal. The halogenated metal may be an alkali metal halide. For example, the electron transport region ETR may include LiF, lithium quinolate (Liq), $Li_2O$, BaO, NaCl, CsF, Yb, RbCl, Rbl, Kl, and/or Kl: Yb, but the embodiments of the present disclosure are not limited thereto. The electron injection layer EIL may also be formed of a mixture material of an electron transport material and an insulating organo-metal salt. The organo-metal salt may be selected from, for example, metal acetates, metal benzoates, metal acetoac-etates, metal acetylacetonates, and metal stearates. The thickness of the electron injection layer EIL may be from about 1 Å to about 100 Å, and from about 3 Å to about 90 Å. When the thickness of the electron injection layer EIL satisfies the above-described range, satisfactory (or suitable) electron injection properties may be obtained without a substantial increase in driving voltage.

The electron transport region ETR may include a hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but is not limited thereto.

The second electrode EL2 may be provided on the electron transport region ETR. The second electrode EL2 may be a common electrode or a cathode. The second electrode EL2 may be a transmissive electrode, a transflective electrode or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof (e.g., AgYb, AgMg and/or MgAg compounds according to content, etc.), or a mixture thereof (e.g., a mixture of Ag and Mg, a mixture of Ag and Yb, etc.). In one or more embodiments, the second electrode EL2 may have a multilayer structure including a reflective film or a transflective film formed of any of the above-described materials, and a transparent conductive film formed of indium tin oxide (ITO), indium zinc oxide (IZO), zinc oxide (ZnO), indium tin zinc oxide (ITZO), etc.

In one or more embodiments, the second electrode EL2 may be connected with an auxiliary electrode. When the second electrode EL2 is connected with the auxiliary electrode, the resistance of the second electrode EL2 may decrease.

Figure 5:
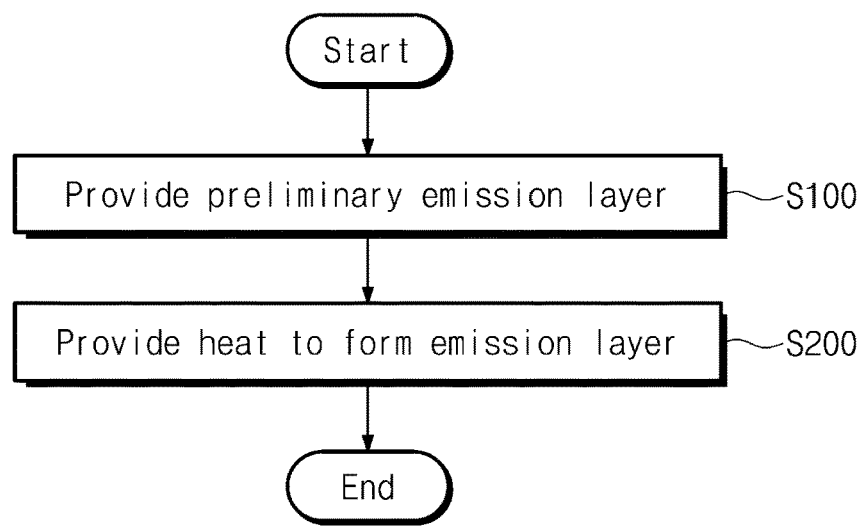
FIG. 5 is a flowchart showing a method for manufacturing a light emitting element according to one or more embodiments.
Figure 6:
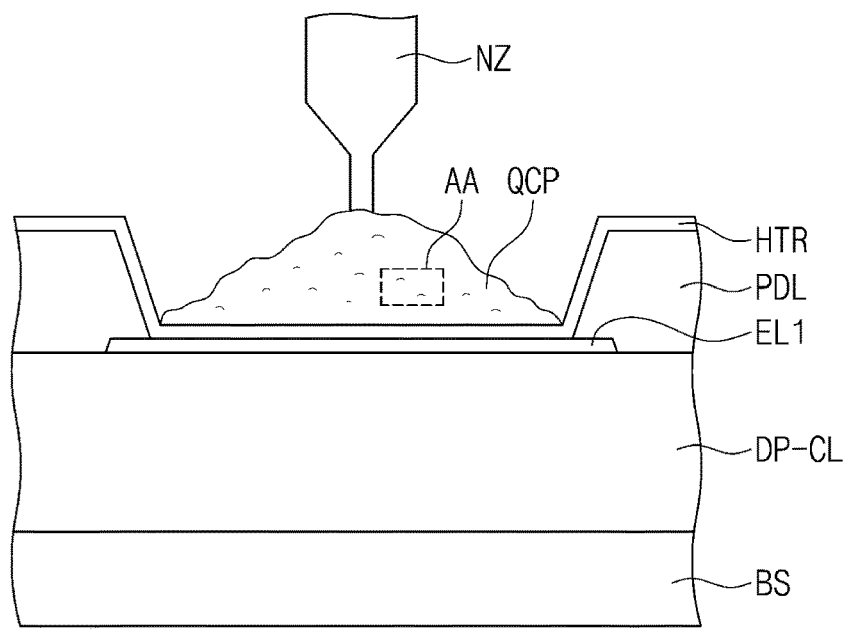
FIG. 6 is a cross-sectional view schematically showing an act of forming an emission layer in a method for manufacturing a light emitting device according to one or more embodiments.
Figure 7:
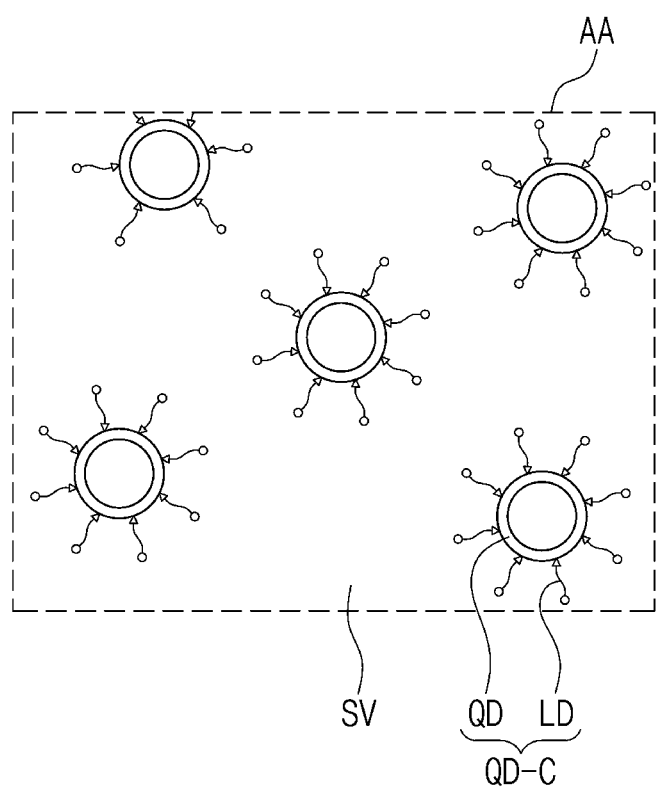
FIG. 7 is a cross-sectional view illustrating a part of a quantum dot composition provided in FIG. 6 in more detail.
Figure 8:
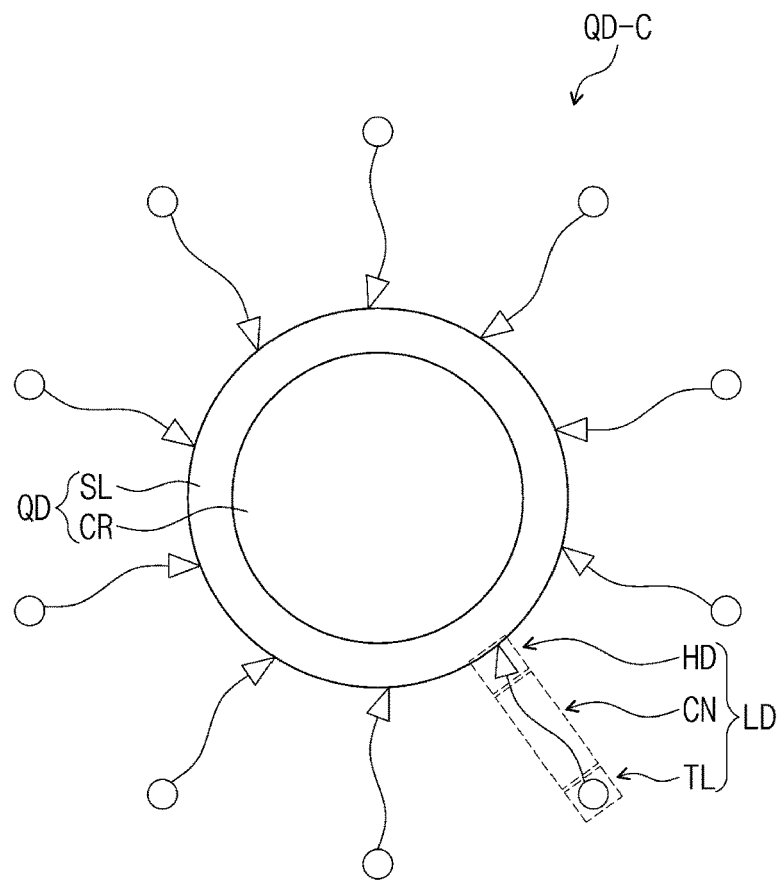
FIG. 8 is a schematic view of a quantum dot complex of one or more embodiments.

FIG. 5 is a flowchart showing a method for manufacturing a light emitting element according to one or more embodiments. FIG. 6 schematically shows an act of providing a preliminary emission layer (S100) in a method for manufacturing a light emitting element according to one or more embodiments. FIG. 7 shows a part (region "AA") of a quantum dot composition QCP provided in FIG. 6 in more detail. FIG. 8 schematically shows a quantum dot QD and a ligand LD bonded to a surface of the quantum dot QD.

A method for manufacturing a light emitting element according to one or more embodiments may include providing a preliminary emission layer (S100), and providing heat to form an emission layer (S200).

The providing of the preliminary emission layer (S100) may be performed by providing a quantum dot composition QCP on a hole transport region HTR. The quantum dot composition QCP may be provided between portions of a pixel defining film PDL through a nozzle NZ. While in FIG. 6, the hole transport region HTR is illustrated as a common layer so as to overlap the pixel defining film PDL, the embodiments of the present disclosure are not limited thereto, and the hole transport region HTR may be provided between the pixel defining film PDL. For example, the hole transport region HTR may be provided between the pixel defining film PDL, using an inkjet printing method.

Referring to FIG. 7, the quantum dot composition QCP of one or more embodiments may include a quantum dot QD and a ligand LD bonded to a surface of the quantum dot QD. The quantum dot QD may have a ligand LD bonded to the surface thereof to form a quantum dot complex QD-C. The quantum dot complex QD-C has the ligand LD bonded to the surface of the quantum dot QD, and may thus keep charge injection properties, and have improved dispersibility and capping properties.

In one or more embodiments, the quantum dot composition QCP may further include an organic solvent SV. For example, the organic solvent SV may include hexane, toluene, chloroform, dimethyl sulfoxide, and/or dimethyl formamide. However, the embodiments of the present disclosure are not limited thereto.

The quantum dot QD may be dispersed in the organic solvent SV and provided to form an emission layer. As the ligand LD is boned to the surface of the quantum dot QD, the dispersibility of the quantum dot QD in the organic solvent SV may increase. In the method for forming the emission layer, evaporating the organic solvent SV may be further included after the providing of the quantum dot composition QCP.

Referring to FIG. 8, the quantum dot QD may include a core CR and a shell SL surrounding (or around) the core CR. However, the embodiments of the present disclosure are not limited thereto, and the quantum dot QD may have a single-layer structure solely having the core CR. The shell SL of the quantum dot QD having the core/shell structure may serve as a protection layer to prevent or reduce the chemical deformation of the core CR so as to maintain semiconductor properties, and/or a charging layer to impart electrophoresis properties to the quantum dot QD. The shell SL may be a single layer or multiple layers. An interface between the core CR and the shell SL may have a concentration gradient, in which the concentration of an element present in the shell SL becomes lower toward the center.

The quantum dot QD of one or more embodiments may be a semiconductor nanocrystal that may be selected from a Group II-VI compound, a Group III-V compound, a Group IV-VI compound, a Group IV element, a Group IV compound, and a combination thereof (combinations thereof).

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof (mixtures thereof); a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V semiconductor compound may further include a Group II metal (e.g., InZnP, etc.).

The Group III-VI compound may include a binary compound such as $In_2S_3$ and/or $In_2Se_3$; a ternary compound such as $InGaS_3$ and/or $InGaSe_3$; or any combination thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

The Group I-III-VI semiconductor compound may include a ternary compound such as $AgInS$, $AgInS_2$, $CuInS$, $CuInS_2$, $CuGaO_2$, $AgGaO_2$, $AgAlO_2$, or any combination thereof.

In this case, a binary compound, a ternary compound, and/or a quaternary compound may be present in a particle in a uniform concentration distribution, or may be present in the same particle in a partially different concentration distribution. In one or more embodiments, a core/shell structure in which one quantum dot surrounds another quantum dot may be present. An interface between a core and a shell may have a concentration gradient in which the concentration of an element present in a shell becomes lower toward the center.

In the quantum dot QD of one or more embodiments, the shell SL may be formed of a metal oxide, a non-metal oxide, a semiconductor compound, or a combination thereof. For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$; or a ternary compound such as $MgAl_2O_4$, $CoFe_2O_4$, $NiFe_2O_4$, and/or $CoMn_2O_4$, but the embodiments of the present disclosure are not limited thereto.

In one or more embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiments of the present disclosure are not limited thereto.

A quantum dot QD may have a full width of half maximum (FWHM) of a light emission wavelength spectrum of about 45 nm or less, for example, about 40 nm or less, or about 30 nm or less, and color purity and/or color reproducibility may be enhanced in the above range. In one or more embodiments, light emitted through such a quantum dot is emitted in all directions, and thus a wide viewing angle may be improved.

In one or more embodiments, although the form of a quantum dot QD is not particularly limited as long as it is a suitable form, a quantum dot in the form of spherical, pyramidal, multi-arm, and/or cubic nanoparticles, nanotubes, nanowires, nanofibers, nanoparticles, etc. may be used.

A quantum dot QD may control the color of emitted light according to the particle size thereof, and thus the quantum dot QD may have various light emission colors such as blue, red, green, etc. The smaller the particle size of the quantum dot QD becomes, the shorter the wavelength region of light that may be emitted. For example, in the quantum dot QD having the same core, the particle size of a quantum dot emitting green light may be smaller than the particle size of a quantum dot emitting red light. In one or more embodiments, in the quantum dot QD having the same core, the particle size of a quantum dot emitting blue light may be smaller than the particle size of a quantum dot emitting green light. However, the embodiments of the present disclosure are not limited thereto, and even in the quantum dot QD having the same core, the particle size may be adjusted according forming-materials and thickness of a shell.

When a quantum dot QD has various light emission colors such as blue, red, green, etc., the quantum dots QD having different light emission colors may have different core materials.

In one or more embodiments, a ligand LD includes a head portion HD bonded to a surface of a quantum dot QD, and a tail portion TL exposed to the outside. The ligand LD may further include a chain portion CN connecting the head portion HD and the tail portion TL.

The head portion HD of the ligand LD is a portion bonded to the surface of the quantum dot QD, and may include a functional group to bind to the surface of the quantum dot QD. The head portion HD may include a thiol group, a dithio acid group, a phosphine group, a catechol group, an amine group, and/or a carboxylic acid group. When the head portion HD includes a single functional group to bind to the surface of the quantum dot QD, the ligand LD may be a monodentate ligand. When the head portion HD includes two functional groups to bind to the surface of the quantum dot QD, the ligand LD may be a bidentate ligand. The head portion HD may include a functional group to bind to the surface of a shell SL of the quantum dot QD, and thus the ligand LD may be effectively (or suitably) bonded to the quantum dot QD.

The tail portion TL of the ligand LD may be bonded to a ligand bonded to another quantum dot, and includes a crosslinkable functional group at a terminal. The crosslinkable functional group is not particularly limited as long as it is a functional group capable of forming a bond with another functional group, and may be, for example, a heat crosslinkable functional group or a photocrosslinkable functional group. In one or more embodiments, the crosslinkable functional group may be a vinyl group, a hydroxy group, a carboxyl group, an epoxy group, an amide group, an amine group, an azide group, an oxetanyl group, and/or an isocyanate group.

The chain portion CN of the ligand LD may connect the head portion HD and the tail portion TL, and adjust the length of the ligand LD to control the dispersibility of a quantum dot complex QD-C in a quantum dot composition QCP. To this end, the chain portion CN may include 2 to 20 carbons. For example, an alkyl group having 2 or more carbon atoms and an alkyl group having 1 or more carbon atoms may be included, or an alkyl group having 3 or more carbon atoms may be included. When the number of carbon atoms in the chain portion CN is less than 2, the distance between the quantum dots QD may be too small (e.g., the quantum dots QD may be too close to each other), and when the number of carbon atoms is greater than 20, the distance between the quantum dots QD may be too large (e.g., the quantum dots QD may be too far from each other). The chain portion CN may further include a functional group according to the type (or kind) of a solvent SV in which the quantum dot complex QD-C is dispersed, for example, may further include an amine group, an oxy group, a thio group, an ester group, an ether group, an aryl group, and/or an amide group.

In one or more embodiments, the chain portion CN may be omitted, and the head portion HD and tail portion TL of the ligand LD may be directly connected.

In one or more embodiments, the ligand LD may be represented by Formula A or Formula B below.

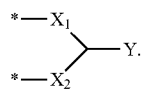

Formula A

Formula B

In Formulae A and B above, X, $X_1$ and $X_2$ may be each independently S or NH, and Y may be represented by any of Formulae 1 to 7 below. In the present description, " * ──────── " indicates a position connected to a quantum dot (e.g., a binding site to the quantum dot). However, the embodiments of the present disclosure are not limited thereto.

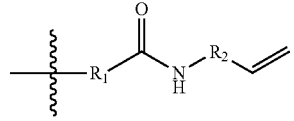

Formula 1

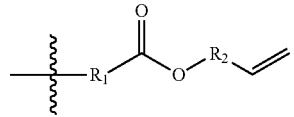

Formula 2

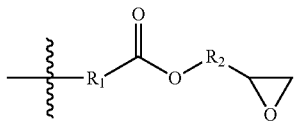

Formula 3

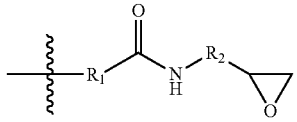

Formula 4

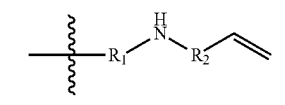

Formula 5

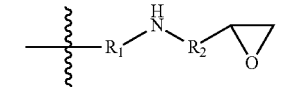

Formula 6

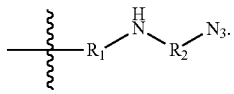

Formula 7

In Formulae 1 to 7 above, $R_1$ may be an alkyl group having 2 to 20 carbon atoms, and $R_2$ may be an alkyl group having 1 to 20 carbon atoms where the sum of the numbers of carbon atoms of $R_1$ and $R_2$ is 20 or less. In Formulae 1 to 7 above,

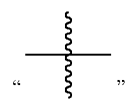

indicates a position connected to Formula A or Formula B.

Figure 9:
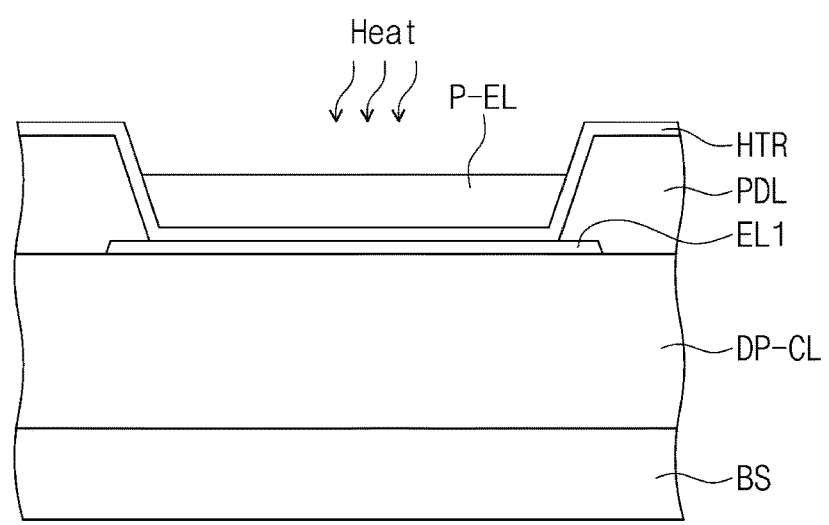
FIG. 9 is a schematic view showing a portion of a method for manufacturing a light emitting element according to one or more embodiments.
Figure 10:
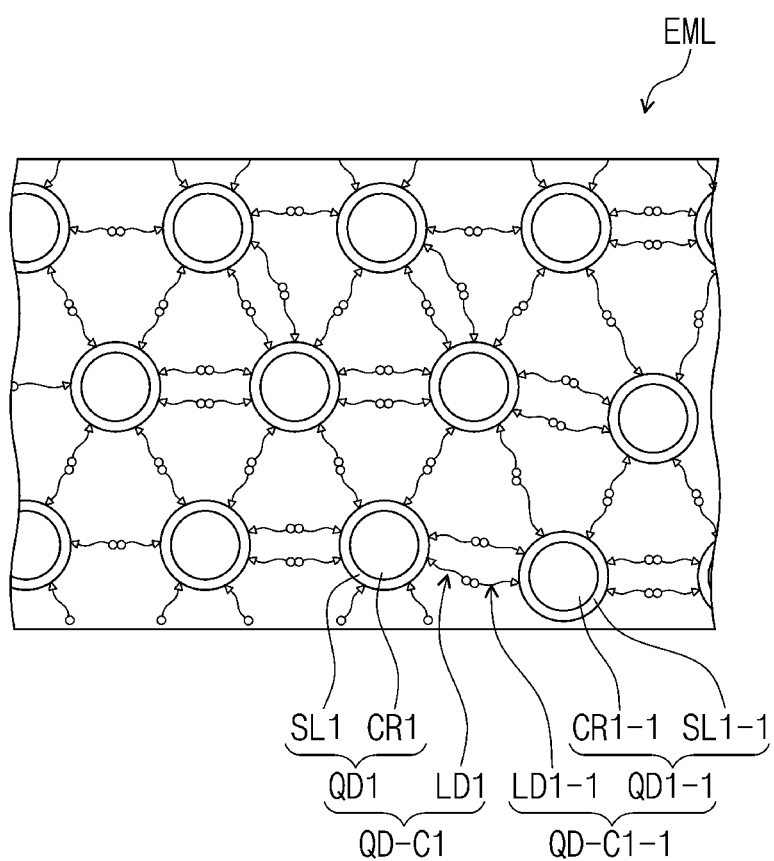
FIG. 10 is a cross-sectional view showing an emission layer according to one or more embodiments.
Figure 11:
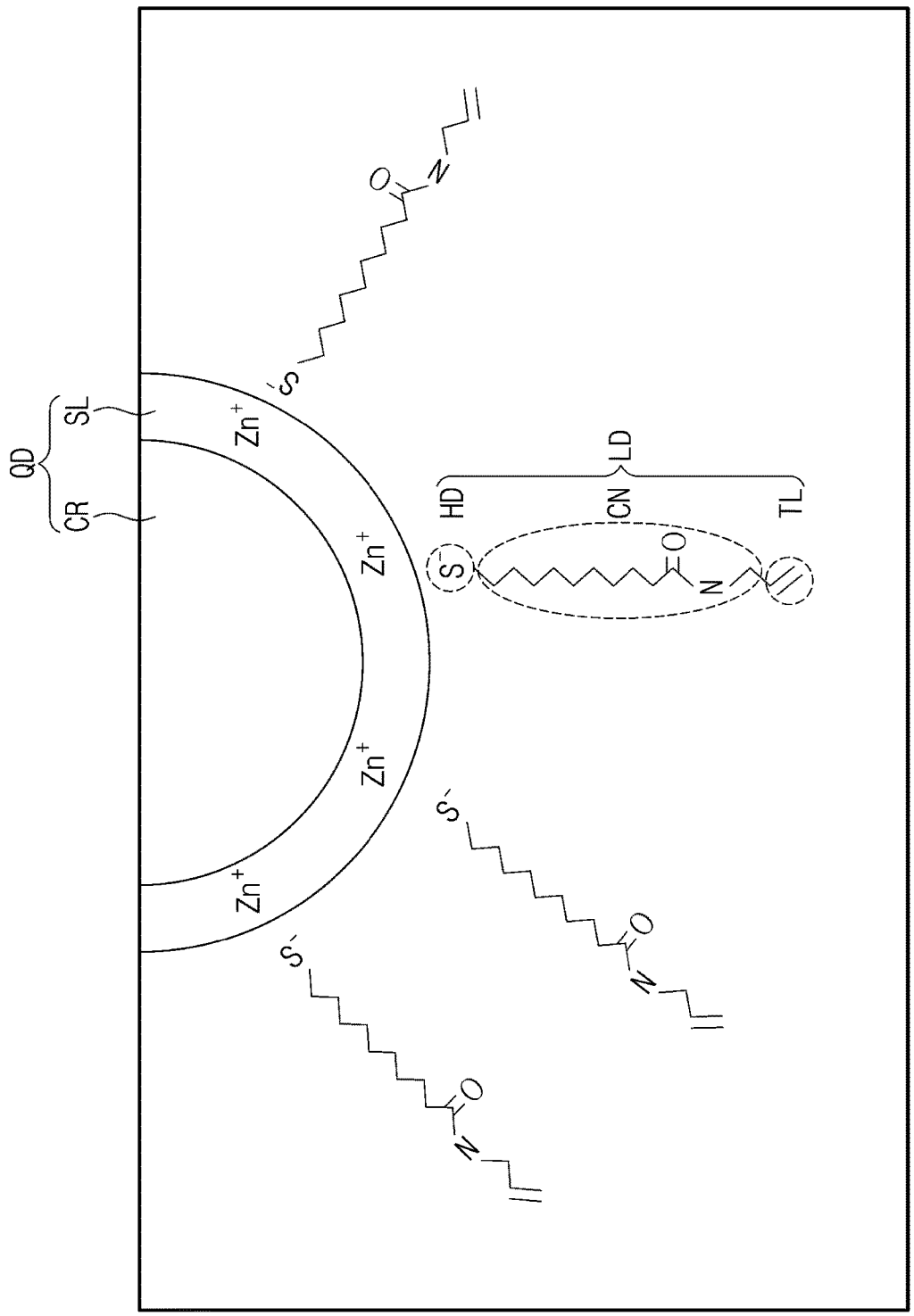
FIG. 11 is a view schematically showing a quantum dot composition according to one or more embodiments.
Figure 12:
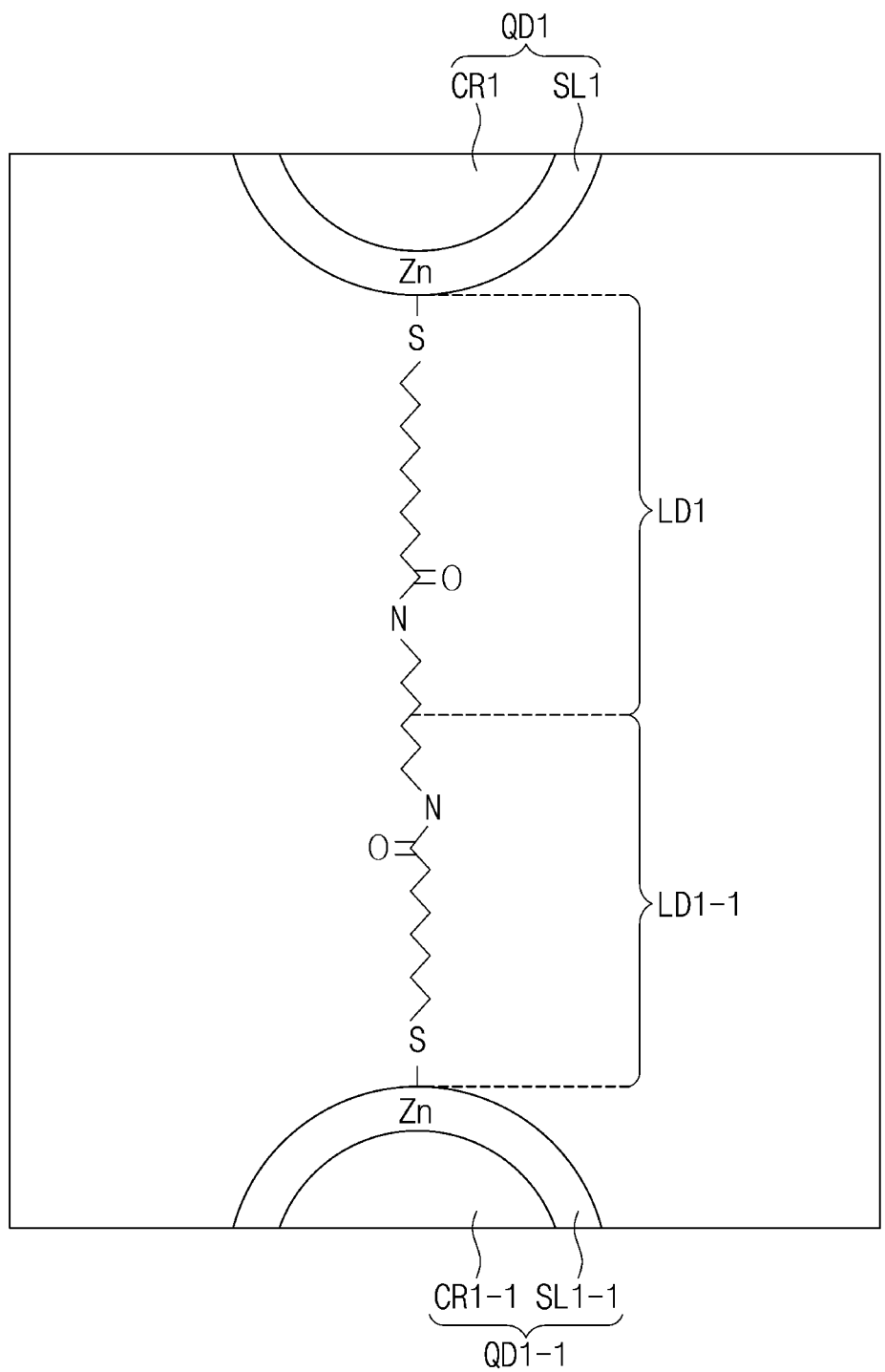
FIG. 12 is a view showing reaction between ligands in a quantum dot composition according to one or more embodiments.

FIG. 9 is a view schematically showing an act of providing heat to form an emission layer (S200) in a method for manufacturing a light emitting element according to one or more embodiments, and FIG. 10 is a view schematically showing a cross section of an emission layer EML formed accordingly. FIG. 11 illustrates a quantum dot composition according to one or more embodiments, and FIG. 12 illustrates a crosslinking reaction performed in the quantum dot composition of FIG. 11.

According to one or more embodiments, the providing of heat to a preliminary emission layer P-EL may be performed by applying heat of 50° C. or higher, 70° C. or higher, or 100° C. or higher to the preliminary emission layer P-EL to provide (e.g., facilitate) baking. The emission layer of the present disclosure may induce bonding between quantum dot complexes QD-C during the baking for forming an emission layer, without an additional process of separately providing heat for bonding between the quantum dot complexes QD-C. In one or more embodiments, the baking may remove an organic solvent SV, etc. included in the quantum dot composition QCP.

Referring to FIG. 10, an emission layer EML includes a plurality of quantum dot complexes QD-C1 and QD-C1-1 connected to each other. When heat is provided to the preliminary emission layer P-EL, the crosslinking reaction between a ligand LD1 bonded to a quantum dot QD1 (including a core CR1 and a shell SL1) and a ligand LD1-1 bonded to the other quantum dot QD1-1 (including a core CR1-1 and a shell SL1-1) occurs, and thus the ligands LD1 and LD1-1 may form a bond with each other. The tail portion of the ligand LD1 includes a crosslinkable functional group, and this crosslinkable functional group is bonded to a crosslinkable functional group of the tail portion of the ligand LD1-1 bonded to another quantum dot QD1-1. Thus, the quantum dot complex QD-C1 may be bonded to other quantum dot complex QD-C1-1.

In FIG. 10, the quantum dot complex QD-C1 is exemplarily illustrated to be formed of approximately three layers, but the embodiments of the present disclosure are not limited thereto. For example, the arrangement of the quantum dot complexes QD-C1 may vary according to the thickness of the emission layer EML, the shape of the quantum dot QD included in the emission layer EML, and the average diameter of the quantum dot QD1. For example, in the emission layer EML, each of the quantum dot complexes QD-C1 may be bonded to at least two adjacent quantum dot complexes to form a single layer, or may form two or three layers.

As illustrated in FIGS. 11 and 12 by way of example only, in the quantum dot complex QD-C1, a compound represented by Formula C is bonded to a ligand LD, and a shell SL includes Zn.

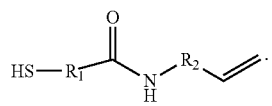

Formula C

In Formula C above, $R_1$ and $R_2$ are the same as defined in Formulae 1 to 7.

In FIG. 11, the head portion HD of the ligand LD, a thiol group, is bonded to Zn, a metal ion included in the shell SL, and thus the ligand LD is effectively (or suitably) bonded to the quantum dot QD, thereby forming a quantum dot complex. The quantum dot QD may have the ligand LD bonded to exhibit excellent dispersibility in an organic solvent even as an inorganic particle.

Referring to FIG. 12, in the baking, the quantum dot complex of FIG. 11 may form a bond through the crosslinking reaction between the vinyl group of a first ligand LD1 bonded to a first quantum dot QD1 and the vinyl group of a 1-1 (first-first) ligand LD1-1 bonded to an adjacent 1-1 (first-first) quantum dot QD1-1. For example, the quantum dot complexes may be positioned close to each other through the crosslinking reaction between ligands LD1 and LD1-1 in an emission layer.

Figure 13:
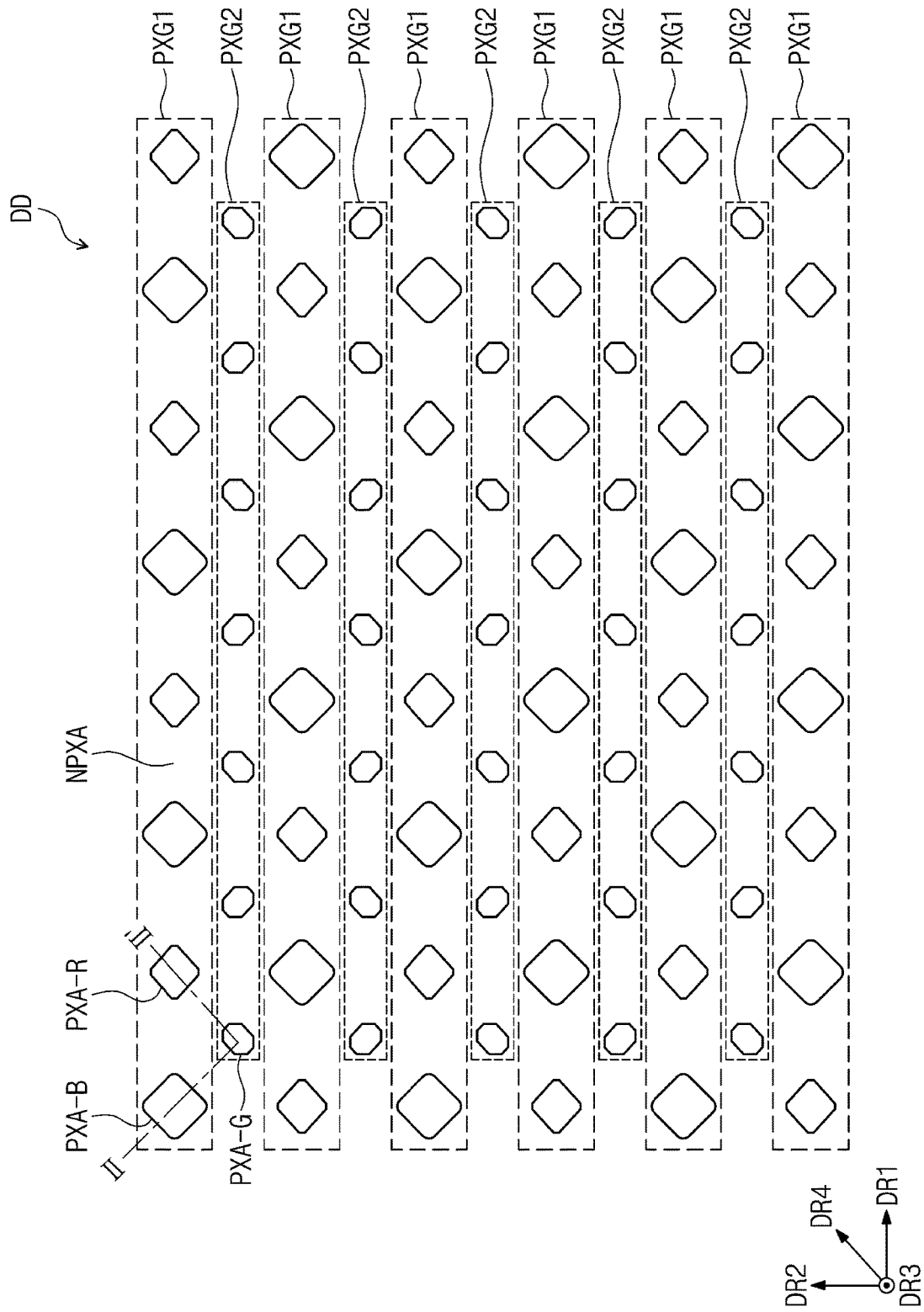
FIG. 13 is a plan view of a display device according to one or more embodiments.
Figure 14:
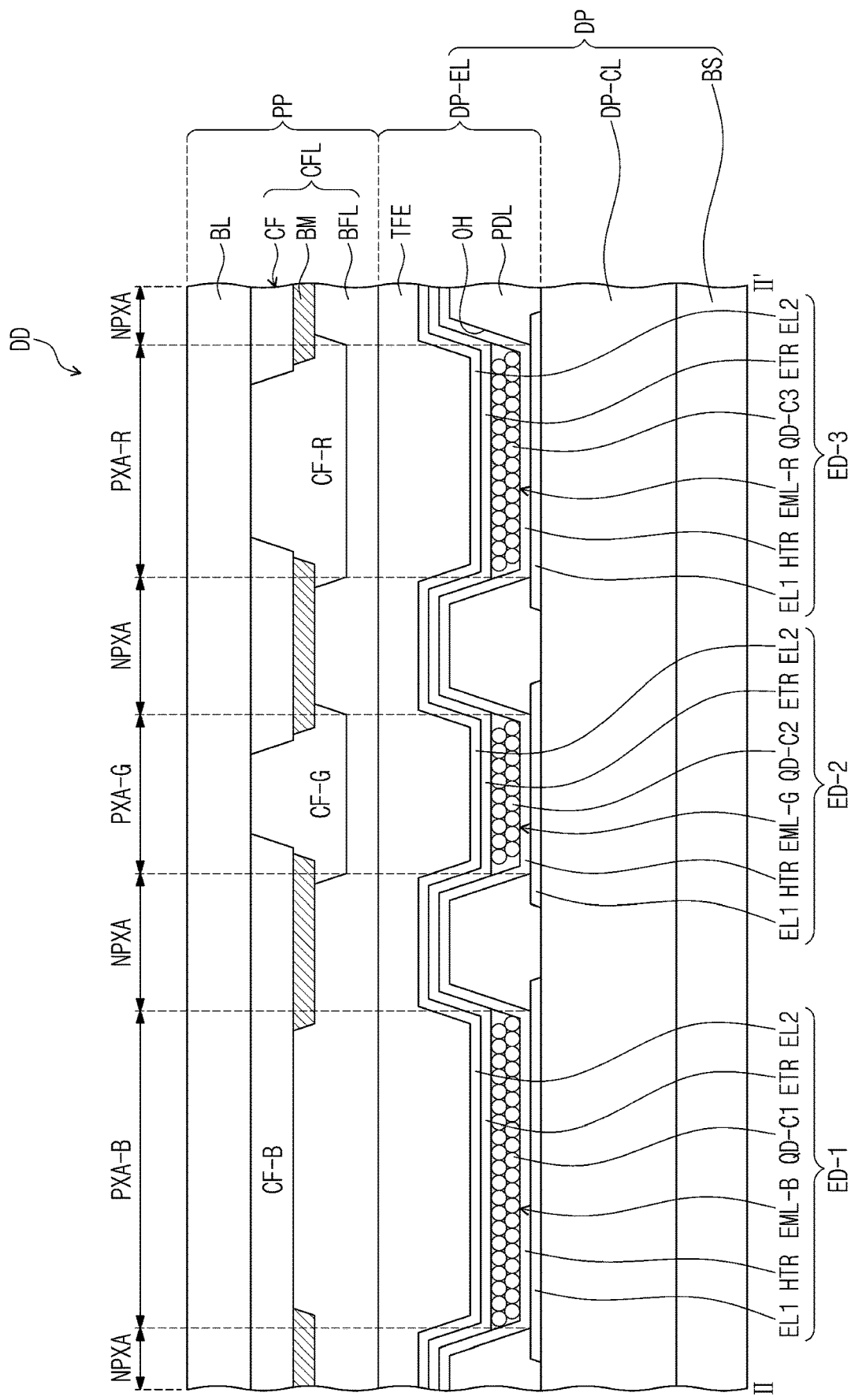
FIG. 14 is a cross-sectional view of a display device corresponding to line II-II' of FIG. 13.

FIG. 13 is a plan view of a display device DD according to one or more embodiments. FIG. 14 is a cross-sectional view of a display device DD according to one or more embodiments. FIG. 14 is a cross-sectional view corresponding to line II-II' of FIG. 13.

The display device DD of one or more embodiments may include a plurality of light emitting elements ED-1, ED-2, and ED-3, and the light emitting elements ED-1, ED-2, and ED-3 may respectively include emission layers EML-B, EML-G, and EML-R respectively having quantum dot complexes QD-C1, QD-C2, and QD-C3.

In one or more embodiments, the display device DD of one or more embodiments may include a display panel DP containing the plurality of light emitting elements ED-1, ED-2 and ED-3, and a light control layer PP disposed on the display panel DP. In some embodiments, the light control layer PP may be omitted from the display device DD of one or more embodiments.

The display panel DP may include a base substrate BS, a circuit layer DP-CL, and a display element layer DP-EL provided on the base substrate BS, and the display element layer DP-EL may include a pixel defining film PDL, light emitting elements ED-1, ED-2 and ED-3 disposed between portions of the pixel defining film PDL, and an encapsulation layer TFE disposed on the light emitting elements ED-1, ED-2 and ED-3.

Referring to FIGS. 13 and 14, the display device DD may include a non-light emission area NPXA and light emission areas PXA-B, PXA-G and PXA-R. Each of the light emission areas PXA-B, PXA-G and PXA-R may be an area to emit light generated from each of the light emitting elements ED-1, ED-2 and ED-3, respectively. The light emission areas PXA-B, PXA-G and PXA-R may be spaced apart from one another on a plane.

The light emission areas PXA-B, PXA-G and PXA-R may be divided into a plurality of groups according to the color of light generated from the light emitting elements ED-1, ED-2 and ED-3. In the display device DD of one or more embodiments illustrated in FIGS. 13 and 14, three light emission areas PXA-B, PXA-G and PXA-R emitting blue light, green light, and red light, respectively, are exemplarily illustrated. For example, the display device DD of one or more embodiments may include a blue light emission area PXA-B, a green light emission area PXA-G, and a red light emission area PXA-R, which are separated from one another.

The plurality of light emitting elements ED-1, ED-2 and ED-3 may emit light in different wavelength regions. For example, in one or more embodiments, the display device DD may include a first light emitting element ED-1 to emit blue light, a second light emitting element ED-2 to emit green light, and a third light emitting element ED-3 to emit red light. However, the embodiments of the present disclosure are not limited thereto, and the first to third light emitting elements ED-1, ED-2 and ED-3 may emit light in the same wavelength region, or emit light in at least one different wavelength region.

For example, the blue light emission area PXA-B, the green light emission area PXA-G, and the red light emission area PXA-R of the display device DD may correspond to the first light emitting element ED-1, the second light emitting element ED-2, and the third light emitting element ED-3, respectively.

A first emission layer EML-B of the first light emitting element ED-1 may include a first quantum dot complex QD-C1. The first quantum dot complex QD-C1 may emit blue light, which is first light.

A second emission layer EML-G of the second light emitting element ED-2, and a third emission layer EML-R of the third light emitting element ED-3 may include a second quantum dot complex QD-C2 and a third quantum dot complex QD-C3, respectively. The second quantum dot complex QD-C2 and the third quantum dot complex QD-C3 may emit green light which is second light, and red light which is third light, respectively.

Each of the first to third quantum dot complexes QD-C1, QD-C2, and QD-C3 may have a quantum dot and a ligand bonded to a quantum dot surface. For example, in one or more embodiments, the first quantum dot complex QD-C1 may include a first quantum dot and a first ligand, the second quantum dot complex QD-C2 may include a second quantum dot and a second ligand, and the third quantum dot complex QD-C3 may include a third quantum dot and a third ligand. For each of the first to third quantum dot complexes (complexes) QD-C1, QD-C2, and QD-C3, the description of the quantum dot complex in the light emitting element of one or more embodiments described above may be equally applied.

In one or more embodiments, first to third quantum dots of the first to third quantum dot complexes QD-C1, QD-C2, and QD-C3 included in the light emitting elements ED-1, ED-2, and ED-3 may be formed of different core materials. In one or more embodiments, the first to third quantum dots of the first to third quantum dot complexes QD-C1, QD-C2, and QD-C3 may be formed of the same core material, or two quantum dots selected from the first to third quantum dots may be formed of the same core material, and the remaining quantum dot may be formed of a different core material.

In one or more embodiments, the first to third quantum dots of the first to third quantum dot complexes QD-C1, QD-C2, and QD-C3 may have different diameters. For example, the first quantum dot used in the first light emitting element ED-1, emitting (to emit) light in a relatively short wavelength range, may have a relatively smaller average diameter than the second quantum dot of the second light emitting element ED-2 and the third quantum dot of the third light emitting element ED-3, each emitting (to emit) light in a relatively long wavelength region. However, the embodiments of the present disclosure are not limited thereto, and the first to third quantum dots may be similar in size. In one or more embodiments, the average diameter of two quantum dots selected from the first to third quantum dots may be similar, and the remaining quantum dot may have a different average diameter.

In one or more embodiments, first to third ligands of the first to third quantum dot complexes QD-C1, QD-C2, and QD-C3 may be the same as or different from one another. The first to third ligands may be selected accordingly based on the light emission wavelengths of the light emitting elements ED-1, ED-2, and ED-3 including the first to third quantum dot complexes QD-C1, QD-C2, and QD-C3.

In the display device DD of one or more embodiments, as shown in FIGS. 13 and 14, the areas of the light emission areas PXA-B, PXA-G and PXA-R each may be different from one another. In this case, the area may refer to an area when viewed on a plane defined by the first direction DR1 and the second direction DR2.

The light emission areas PXA-B, PXA-G and PXA-R may have different areas according to the color emitted from the emission layers EML-B, EML-G and EML-R of the light emitting elements ED-1, ED-2 and ED-3. For example, referring to FIGS. 13 and 14, the blue light emission area PXA-B corresponding to the first light emitting element ED-1 emitting (to emit) blue light may have the largest area, and the green light emission area PXA-G corresponding to the second light emitting element ED-2 generating (to emit or generate) green light may have the smallest area in the display device DD. However, the embodiments of the present disclosure are not limited thereto, and the light emission areas PXA-B, PXA-G and PXA-R may emit light other than blue light, green light and red light, or the light emission areas PXA-B, PXA-G and PXA-R may have the same area, or the light emission areas PXA-B, PXA-G, and PXA-R may be provided at different area ratios from those shown in FIG. 13.

Each of the light emission areas PXA-B, PXA-G and PXA-R may be an area separated by a pixel defining film PDL. The non-light emission areas NPXA may be areas between neighboring light emission areas PXA-B, PXA-G and PXA-R, and may correspond to the pixel defining film PDL. In the present description, each of the light emission areas PXA-B, PXA-G and PXA-R may correspond to a pixel. The pixel defining film PDL may separate the light emitting elements ED-1, ED-2 and ED-3. The emission layers EML-B, EML-G and EML-R of the light emitting elements ED-1, ED-2 and ED-3 may be disposed in an opening OH defined by the pixel defining film PDL, and may be thus separated from each other.

The pixel defining film PDL may be formed of a polymer resin. For example, the pixel defining film PDL may be formed including a polyacrylate-based resin and/or a polyimide-based resin. In one or more embodiments, the pixel defining film PDL may be formed by further including an inorganic material, in addition to the polymer resin. In one or more embodiments, the pixel defining film PDL may be formed including a light absorbing material, or may be formed including a black pigment and/or a black dye. The pixel defining film PDL formed including a black pigment and/or a black dye may implement a black pixel defining film. When forming the pixel defining film PDL, carbon black may be used as a black pigment and/or a black dye, but the embodiments of the present disclosure are not limited thereto.

In one or more embodiments, the pixel defining film PDL may be formed of an inorganic material. For example, the pixel defining film PDL may be formed including silicon nitride (SiNx), silicon oxide (SiOx), silicon oxide (SiOxNy), etc. The pixel defining film PDL may define light emission areas PXA-B, PXA-G, and PXA-R. The light emission areas PXA-B, PXA-G, and PXA-R, and a non-light emission area NPXA may be separated by the pixel defining film PDL.

Each of the light emitting elements ED-1, ED-2 and ED-3 may include a first electrode EL1, a hole transport region HTR, a corresponding emission layer EML-B, EML-G or EML-R, an electron transport region ETR, and a second electrode EL2. The description provided in connection with FIG. 4 may be equally applied to the first electrode ELI, the hole transport region HTR, the electron transport region ETR, and the second electrode EL2, except that the first to third quantum dot complexes QD-C1, QD-C2, and QD-C3 included in the emission layers EML-B, EML-G, and EML-R are different from one another in the light emitting elements ED-1, ED-2, and ED-3 included in the display device DD of one or more embodiments. In one or more embodiments, each of the light emitting elements ED-1, ED-2, and ED-3 may further include a capping layer between the second electrode EL2 and the encapsulation layer TFE.

An encapsulation layer TFE may cover the light emitting elements ED-1, ED-2 and ED-3. The encapsulation layer TFE may be a single layer or a laminated layer of a plurality of layers. The encapsulation layer TFE may be a thin film encapsulation layer. The encapsulation layer TFE protects the light emitting elements ED-1, ED-2 and ED-3. The encapsulation layer TFE may cover an upper surface of the second electrode EL2 disposed in the opening OH, and may fill the opening OH.

While in FIG. 14, the hole transport region HTR and the electron transport region ETR are illustrated as a common layer while covering the pixel defining film PDL, the embodiments of the present disclosure are not limited thereto. In one or more embodiments, the hole transport region HTR and the electron transport region ETR may be disposed in the opening OH defined by the pixel defining film PDL.

For example, when the hole transport region HTR and the electron transport region ETR, in addition to the emission layers EML-B, EML-G, and EML-R, are provided through an inkjet printing method, the hole transport region HTR, the emission layers EML-B, EML-G, and EML-R, the electron transport region ETR, etc. may be provided corresponding to the defined opening OH between portions of the pixel defining layer PDL. However, the embodiments are not limited thereto, and as shown in FIG. 14, the hole transport region HTR and the electron transport region ETR may cover the pixel defining layer PDL without being patterned, and may be provided as one common layer regardless of a method of providing each functional layer.

In the display device DD of one or more embodiments illustrated in FIG. 14, although the thicknesses of the emission layers EML-B, EML-G, and EML-R of the first to third light emitting elements ED-1, ED-2, and ED-3 are illustrated to be similar to one another, the embodiments are not limited thereto. For example, in one or more embodiments, the thicknesses of the emission layers EML-B, EML- G, and EML-R of the first to third light emitting elements ED-1, ED-2, and ED-3 may be different from one another.

Referring to FIG. 13, the blue light emission areas PXA-B and the red light emission areas PXA-R may be alternately arranged in the first direction DR1 to form a first group PXG1. The green light emission areas PXA-G may be arranged in the first direction DR1 to form a second group PXG2.

The first group PXG1 and the second group PXG2 may be spaced apart in the second direction DR2. Each of the first group PXG1 and the second group PXG2 may be provided in plural. The first groups PXG1 and the second groups PXG2 may be alternately arranged in the second direction DR2.

One green light emission area PXA-G may be disposed spaced apart from one blue light emission area PXA-B or one red light emission area PXA-R in the fourth direction DR4. The fourth direction DR4 may be a direction between the first direction DR1 and the second direction DR2.

The arrangement structure of the light emission areas PXA-B, PXA-G and PXA-R shown in FIG. 13 may have a PenTile®/PENTILE® structure or pattern (PENTILE® is a registered trademark owned by Samsung Display Co., Ltd.). However, the arrangement structure of the light emission areas PXA-B, PXA-G and PXA-R in the display device DD according to one or more embodiments is not limited to the arrangement structure shown in FIG. 13. For example, in one or more embodiments, the light emission areas PXA-B, PXA-G and PXA-R may have a stripe structure (or pattern), in which the blue light emission area PXA-B, the green light emission area PXA-G, and the red light emission area PXA-R may be alternately arranged along the first direction DR1.

Referring to FIG. 14, the display device DD of one or more embodiments further includes a light control layer PP. The light control layer PP may block or reduce external light incident to the display panel DP from the outside the display device DD. The light control layer PP may block or reduce a part of external light. The light control layer PP may perform a reflection preventing (or reflection reduction) function minimizing (or reducing) the reflection due to external light.

In one or more embodiments illustrated in FIG. 14, the light control layer PP may include a color filter layer CFL. For example, the display device DD of one or more embodiments may further include the color filter layer CFL disposed on the light emitting elements ED-1, ED-2, and ED-3 of the display panel DP.

In the display device DD of one or more embodiments, the light control layer PP may include a base layer BL and a color filter layer CFL.

The base layer BL may be a member providing a base surface on which the color filter layer CFL is disposed. The base layer BL may be a glass substrate, a metal substrate, a plastic substrate, etc. However, the embodiments of the present disclosure are not limited thereto, and the base layer BL may be an inorganic layer, an organic layer, or a complex material layer (e.g., including an inorganic material and an organic material).

The color filter layer CFL may include a light blocking unit BM and a color filter CF. The color filter may include a plurality of filters CF-B, CF-G, and CF-R. For example, the color filter layer CFL may include a first filter CF-B to transmit a first color light, a second filter CF-G to transmit a second color light, and a third filter CF-R to transmit a third color light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment and/or a dye. The first filter CF-B may include a blue pigment and/or a blue dye, the second filter CF-G may include a green pigment and/or a green dye, and the third filter CF-R may include a red pigment and/or a red dye.

However, the embodiments of the present disclosure are not limited thereto, and the first filter CF-B may not include a pigment or a dye. The first filter CF-B may include a polymer photosensitive resin, but not include a pigment or a dye. The first filter CF-B may be transparent. The first filter CF-B may be formed of a transparent photosensitive resin.

The light blocking unit BM may be a black matrix. The light blocking unit BM may be formed including an organic light blocking material or an inorganic light blocking material, both including a black pigment and/or a black dye. The light blocking unit BM may prevent or reduce light leakage, and separate (e.g., define) boundaries between the adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic material layer including at least one inorganic material among (selected from) silicon nitride, silicon oxide, and silicon oxynitride. The buffer layer BFL may be formed of a single layer or a plurality of layers.

In one or more embodiments shown in FIG. 14, the first color filter CF-B of the color filter layer CFL is illustrated to overlap the second filter CF-G and the third filter CF-R, but the embodiments of the present disclosure are not limited thereto. For example, the first to third filters CF-B, CF-G and CF-R may be separated by the light blocking unit BM and may not overlap one another. In one or more embodiments, the first to third filters CF-B, CF-G and CF-R may be disposed corresponding respectively to the blue light emission area PXA-B, green light emission area PXA-G, and red light emission area PXA-R.

In one or more embodiments, the display device DD may include a polarizing layer as a light control layer PP, instead of the color filter layer CFL. The polarizing layer may block or reduce external light provided to the display panel DP from the outside. The polarizing layer may block or reduce a part of external light.

In one or more embodiments, the polarizing layer may reduce reflected light generated in the display panel DP by external light. For example, the polarizing layer may function to block or reduce reflected light, where light provided from the outside the display device DD is incident to the display panel DP and exits again. The polarizing layer may be a circular polarizer having a reflection preventing (or reflection reducing) function, or the polarizing layer may include a linear polarizer and a λ/4 phase retarder. The polarizing layer may be disposed on the base layer BL to be exposed, or the polarizing layer may be disposed under the base layer BL.

Figure 15:
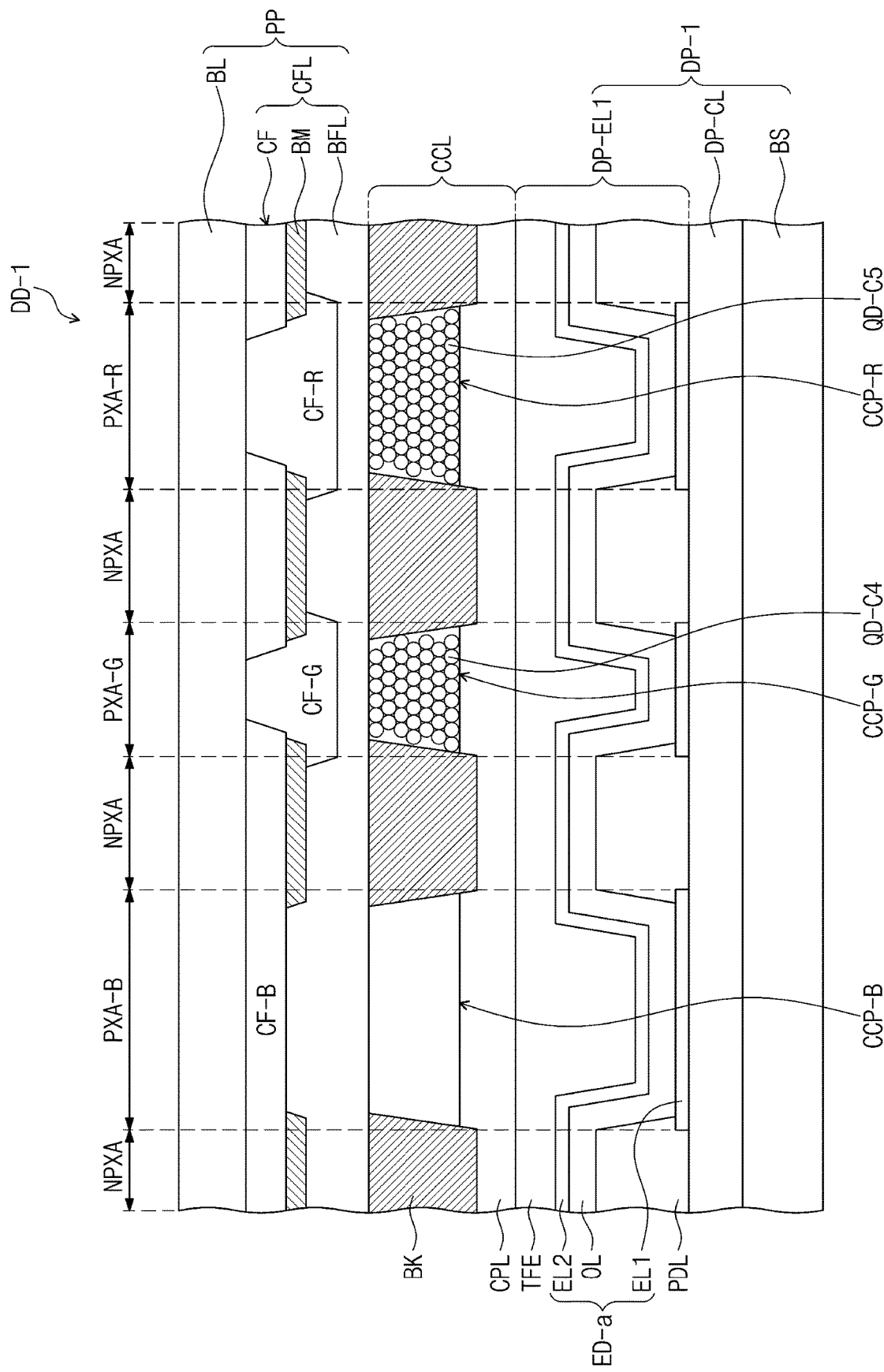
FIG. 15 is a cross-sectional view of a display device according to one or more embodiments.

FIG. 15 is a cross-sectional view of a display device DD-1 of one or more other embodiments of the present disclosure. In the description of the display device DD-1 according to one or more embodiments, content overlapping the one described above with reference to FIGS. 1 to 17 will not be described again, and the differences will be mainly described.

Referring to FIG. 15, the display device DD-1 of one or more embodiments may include a light conversion layer CCL disposed on a display panel DP-1. In one or more embodiments, the display device DD-1 may further include a color filter layer CFL. The color filter layer CFL may be disposed between the base layer BL and the light conversion layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL provided on the base substrate BS, and a display element layer DP-EL1.

The display element layer DP-EL1 includes a light emitting element ED-a, and the light emitting element ED-a may include a first electrode EL1 and a second electrode EL2 facing each other, and a plurality of layers OL disposed between the first electrode EL1 and the second electrode EL2. The plurality of layers OL may include a hole transport region HTR (FIG. 4), an emission layer EML (FIG. 4), and an electron transport region ETR (FIG. 4). An encapsulation layer TFE may be disposed on the light emitting element ED-a.

In the light emitting element ED-a, the same content as the one described with reference to FIG. 4 may be applied to the first electrode EL1, the hole transport region HTR, the electron transport region ETR, and the second electrode EL2. However, in the light emitting element ED-a included in the display panel DP-1 of one or more embodiments, the emission layer may include a host and a dopant, which are organic electroluminescent materials, or may include the quantum dot complex described with reference to FIGS. 1 to 13. In the display panel DP-1 of one or more embodiments, the light emitting element ED-a may emit blue light.

The light conversion layer CCL may include a plurality of partition walls BK disposed spaced apart from each other, and light control units CCP-B, CCP-G and CCP-R disposed between the partition walls BK. The partition walls BK may be formed including a polymer resin and a coloring additive. The partition walls BK may be formed including a light absorbing material, or formed including a pigment and/or a dye. For example, the partition walls BK may include a black pigment and/or a black dye to implement a black partition wall. When forming the black partition wall, carbon black and/or the like may be used as a black pigment and/or a black dye, but the embodiments of the present disclosure are not limited thereto.

The light conversion layer CCL may include a first light control unit CCP-B to transmit first light, a second light control unit CCP-G including a fourth quantum dot complex QD-C4 to convert the first light to second light, and a third light control unit CCP-R including a fifth quantum dot complex QD-05 to convert the first light to third light. The second light may be light of a longer wavelength region than the first light, and the third light may be light of a longer wavelength region than the first light and the second light. For example, the first light may be blue light, the second light may be green light, and the third light may be red light. Regarding the quantum dot complexes (or complexes) QD-C4 and QD-05 included in the light control units CCP-G and CCP-R, the same content as the one for the quantum dot complex used in the emission layer illustrated in FIG. 14 may be applied.

The light conversion layer CCL may further include a capping layer CPL. The capping layer CPL may be disposed on the light control units CCP-B, CCP-G and CCP-R, and the partition walls BK. The capping layer CPL may serve to prevent or reduce penetration of moisture and/or oxygen (hereinafter, referred to as "moisture/oxygen"). The capping layer may be disposed on the light control units CCP-B, CCP-G and CCP-R to prevent or reduce the exposure of the light control units CCP-B, CCP-G and CCP-R to moisture/oxygen. The capping layer CPL may include at least one inorganic layer.

The display device DD-1 of one or more embodiments may include a color filter layer CFL disposed on the light conversion layer CCL, and the descriptions of FIG. 14 may be equally applied to the color filter layer CFL and the base layer BL.

Figure 16:
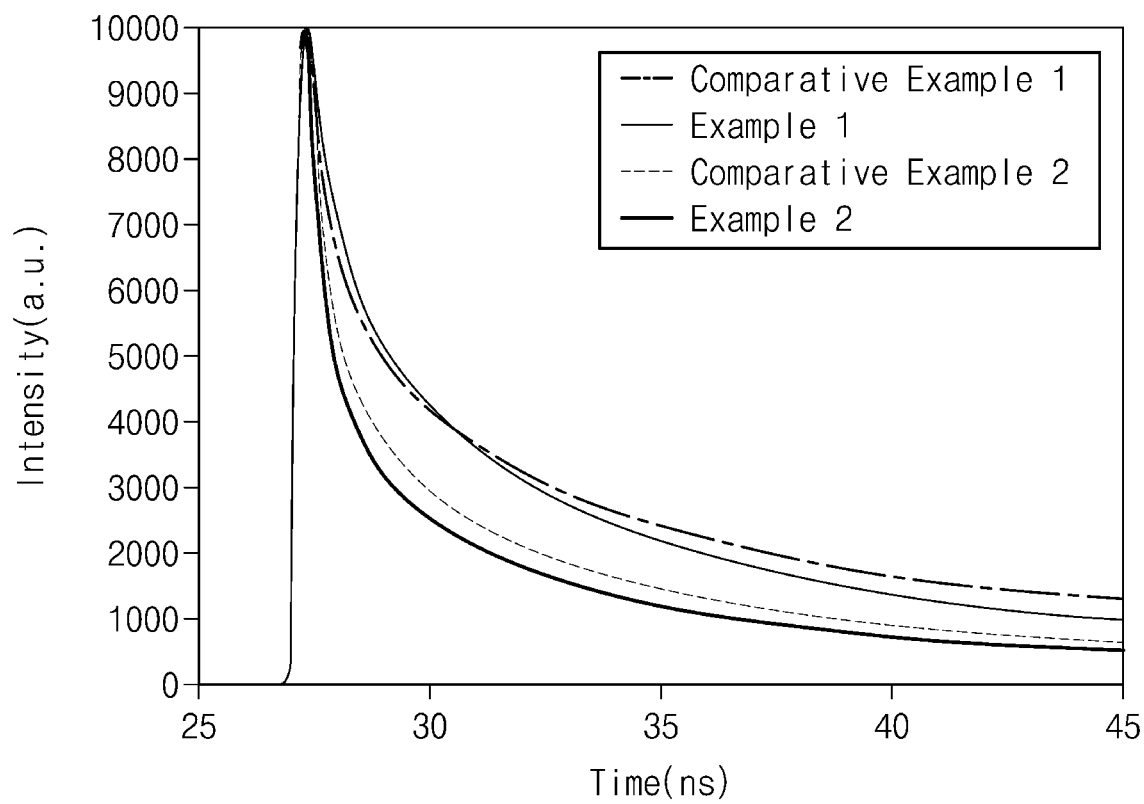
FIG. 16 is a graph showing analysis results of Examples and Comparative Examples.

FIG. 16 is a graph measuring electron transition time for Examples 1 and 2, and Comparative Examples 1 and 2. The electronic transition time analysis was performed by measuring relative changes in intensity measured using Time Resolved Photoluminescence. Example 1 is an evaluation for a quantum dot composition including a quantum dot to which a ligand represented by Formula 5-1 is bonded, and Example 2 is an evaluation for an emission layer formed by baking the quantum dot composition of Example 1. Comparative Example 1 is an evaluation for a quantum dot composition including a quantum dot to which an oleic acid ligand represented by Comparative Example Formula is bonded, and Comparative Example 2 is an evaluation for an emission layer formed by baking the quantum dot composition of Comparative Example 1. The conditions of Examples and Comparative Examples are all the same except for different ligands.

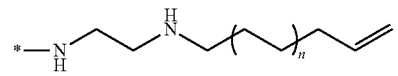

Formula 5-1

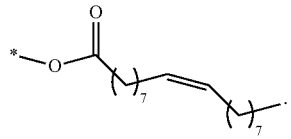

Comparative Example Formula

In the present disclosure, the electron transition time refers to the time it took for the electrons to turn from an excited state into a ground state, and the lower the intensity during this time, the shorter the electron transition time. Referring to FIG. 16, it is seen that Example 2 has the shortest electron transition time over the entire time compared to Example 1, and Comparative Examples 1 and 2. Because the electron transition time becomes shorter when quantum dots get closer to each other, it is believed that the distance between the quantum dots of Example 2 is closest. Accordingly, the quantum dot composition according to the present disclosure includes a crosslinkable functional group at a terminal of a tail portion, and may be effectively (or suitably) bonded to a ligand bonded to another quantum dot, thereby reducing the distance between the quantum dots in an emission layer so as to increase the stacking density of the quantum dots and decrease voids, and thus improved luminous efficiency may be expected.

The quantum dot composition according to one or more embodiments of the present disclosure includes a quantum dot complex in which a ligand is bonded to a surface of a quantum dot, and the ligand includes a crosslinkable functional group in a tail portion thereof to increase the dispersibility and capping properties of the quantum dot complex in the quantum dot composition, and to exhibit excellent luminous efficiency when applied to light emitting elements.

In related art, when a ligand is bonded to a surface of a quantum dot, the dispersibility and capping properties of the quantum dot may be improved in an organic solvent, but when applied to a light emitting element, the ligand boned to the quantum dot inhibits charge injection properties and may decrease luminous efficiency of the light emitting element. However, the quantum dot complex according to one or more embodiments of the present disclosure includes crosslinkable functional groups in a tail portion of the ligand, and these functional groups form a crosslinking reaction in an emission layer and reduce the distance between the quantum dots. Accordingly, the quantum dot complex connected through the ligand increases the stacking density of the quantum dots in the emission layer and decreases voids, thus preventing or reducing degradation of charge injection properties, and improving luminous efficiency of the light emitting element.

A quantum dot composition of one or more embodiments may be used as an emission layer material capable of exhibiting improved luminous efficiency, as a ligand bonded to a surface of a quantum dot includes a charge injection property moiety to prevent or reduce the degradation of the charge injection property even when applied to an emission layer.

A light emitting element and a display device of one or more embodiments may exhibit improved luminous efficiency and service life, by including quantum dots that may prevent or reduce the degradation of charge injection properties in an emission layer.

Although the present disclosure has been described with reference to example embodiments of the present disclosure, it will be understood that the present disclosure should not be limited to these example embodiments, but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. A quantum dot composition comprising:
   a quantum dot; and
   a ligand bonded to a surface of the quantum dot,
   wherein the ligand is represented by Formula A or Formula B:

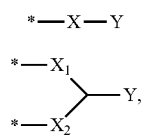

Formula A

Formula B in Formulae A and B,
$X$, $X_1$ and $X_2$ are each independently S or NH, and
$Y$ is represented by at least one among Formulae 1 to 7:

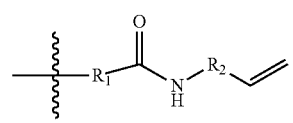

Formula 1

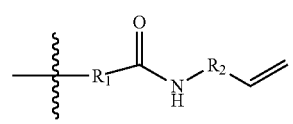

Formula 2

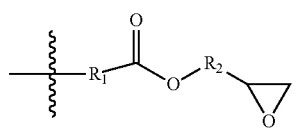

Formula 3

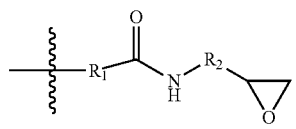

Formula 4

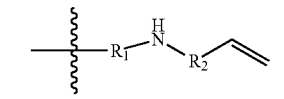

Formula 5

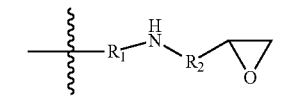

Formula 6

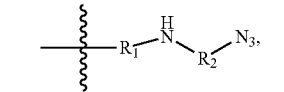

Formula 7 and in Formulae 1 to 7,

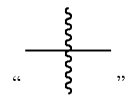

indicates a position connected to Formula A or Formula B, and $R_1$ and $R_2$ are each independently an alkyl group having 1 to 20 carbon atoms, where a sum total number of carbon atoms of $R_1$ and $R_2$ is 20 or less.

2. The quantum dot composition of claim 1, the quantum dot composition further comprising an organic solvent, wherein the quantum dot is dispersed in the organic solvent.

3. The quantum dot composition of claim 1, wherein the quantum dot is a semiconductor nanocrystal comprising a core and a shell around the core.

4. A light emitting element comprising:
   a first electrode;
   a second electrode facing the first electrode; and
   an emission layer between the first electrode and the second electrode, the emission layer comprising a plurality of quantum dot complexes, each of the plurality of quantum dot complexes comprising a quantum dot and a ligand bonded to a surface of the quantum dot,
   wherein each of the plurality of quantum dot complexes is bonded to at least two other quantum dot complexes of the plurality of quantum dot complexes by cross-linking the respective ligands of the other quantum dot complexes, and wherein the ligand of each of the plurality of quantum dot complexes, before being cross-linked to ligands of the other quantum dot complexes, is represented by Formula A or Formula B:

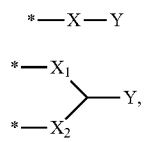

Formula A

Formula B in Formulae A and B,

X, $X_1$ and $X_2$ are each independently S or NH,

Y is represented by at least one among Formulae 1 to 7, and

"* ——————" indicates a binding site to the quantum dot:

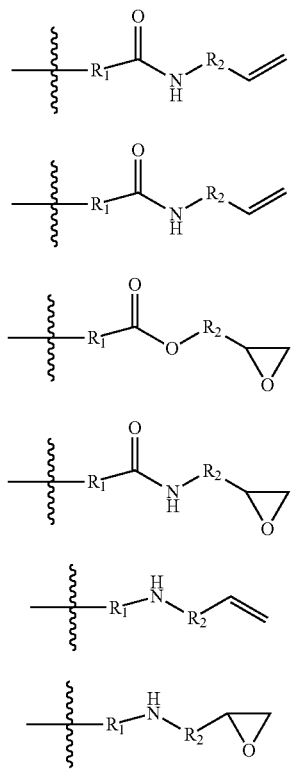

Formula 1

Formula 2

Formula 3

Formula 4

Formula 5

Formula 6

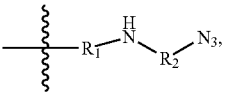

Formula 7 in Formulae 1 to 7,

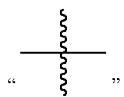

indicates a position connected to Formula A and Formula B, and $R_1$ and $R_2$ are ach independently an alkyl group having 1 to 20 carbon atoms, where a sum total number of carbon atoms of $R_1$ and $R_2$ is 20 or less.

5. The light emitting element of claim 4, wherein the quantum dot comprises
a core and a shell around the core.

6. A display device comprising:
a plurality of light emitting elements; and
a light conversion layer on the plurality of light emitting elements, the light conversion layer comprising a light control unit comprising a plurality of quantum dots connected to each other through binding of ligands,
wherein each of the plurality of light emitting elements comprises a first electrode, a second electrode facing the first electrode, and an emission layer between the first electrode and the second electrode.

7. The display device of claim 6, wherein the light emitting elements are to emit a first color light, and
the light control unit comprises:
a first light control unit to transmit the first color light;
a second light control unit to convert the first color light into a second color light; and
a third light control unit to convert the first color light into a third color light.

8. The display device of claim 6, wherein each of the plurality of quantum dots comprises a core and a shell around the core, and
wherein a ligand of the ligands comprises a hydrophilic group bonded to a surface of a corresponding one of the plurality of quantum dots.

9. The display device of claim 8, wherein the hydrophilic group is a thiol group, a dithio acid group, a phosphine group, a catechol group, an amine group, and/or a carboxylic acid group.

10. The display device of claim 7, further comprising a color filter layer on the light emitting elements,
wherein the color filter layer comprises:
a first filter to transmit the first color light;
a second filter to transmit the second color light; and
a third filter to transmit the third color light.

* * * * *

UNITED STATES PATENT AND TRADEMARK OFFICE
CERTIFICATE OF CORRECTION

PATENT NO.         : 12,331,235 B2                                  Page 1 of 1
APPLICATION NO.    : 17/219442
DATED              : June 17, 2025
INVENTOR(S)        : Yunku Jung et al.

It is certified that error appears in the above-identified patent and that said Letters Patent is hereby corrected as shown below:

In the Claims

In Column 28, Line 5, in Claim 4, after " 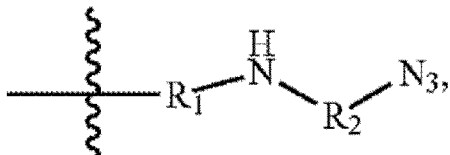 " insert -- and --.

In Column 25, Line 15, in Claim 4, delete "and" and insert -- or --.

In Column 28, Line 17, in Claim 4, delete "ach" and insert -- each --.

Signed and Sealed this
Sixth Day of January, 2026

John A. Squires
*Director of the United States Patent and Trademark Office*